(12) United States Patent
Bartlow et al.

(10) Patent No.: US 12,408,282 B2
(45) Date of Patent: Sep. 2, 2025

(54) ELECTRONIC DEVICES HAVING DIFFERENTIALLY STRENGTHENED COVER MEMBERS

(71) Applicant: Apple Inc., Cupertino, CA (US)

(72) Inventors: Christopher C. Bartlow, Menlo Park, CA (US); Dale N. Memering, Langhome, PA (US); Tyler A. Marshall, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 221 days.

(21) Appl. No.: 17/986,959

(22) Filed: Nov. 15, 2022

(65) Prior Publication Data

US 2023/0232558 A1     Jul. 20, 2023

Related U.S. Application Data

(60) Provisional application No. 63/300,984, filed on Jan. 19, 2022.

(51) Int. Cl.
*H05K 5/03* (2006.01)
*C03C 21/00* (2006.01)
*H05K 5/00* (2006.01)

(52) U.S. Cl.
CPC ............. *H05K 5/03* (2013.01); *C03C 21/002* (2013.01); *H05K 5/0018* (2022.08); *H05K 5/0086* (2013.01)

(58) Field of Classification Search
CPC ............. C03C 3/087–097; C03C 21/00; C03C 21/002–005; H05K 5/00; H05K 5/0013; H05K 5/0018; H05K 5/0086; H05K 5/03

USPC ................................. 361/679.21–679.22, 807
See application file for complete search history.

(56) References Cited

U.S. PATENT DOCUMENTS

| | | |
|---|---|---|
| 3,287,200 A | 11/1966 | Hess et al. |
| 8,652,639 B2 | 2/2014 | Chu et al. |
| 9,187,358 B2 | 11/2015 | Luo et al. |
| 9,221,715 B2 | 12/2015 | Rogers et al. |
| 9,292,634 B2 | 3/2016 | Ahmed et al. |
| 9,725,359 B2 | 8/2017 | Weber |
| 9,790,128 B2 | 10/2017 | Garner et al. |
| 9,886,062 B2 | 2/2018 | Qian et al. |
| 9,946,302 B2 | 4/2018 | Franklin et al. |
| 10,071,933 B2 | 9/2018 | Wang et al. |
| 10,206,298 B2 | 2/2019 | Memering et al. |
| 10,781,135 B2 | 9/2020 | Weber et al. |
| 10,899,660 B2 | 1/2021 | Luzzato et al. |
| 11,247,937 B2 | 2/2022 | Luzzato et al. |
| 2005/0184637 A1 | 8/2005 | Sugawara et al. |

(Continued)

FOREIGN PATENT DOCUMENTS

| | | |
|---|---|---|
| CN | 1491911 | 4/2004 |
| CN | 102131740 | 7/2011 |

(Continued)

*Primary Examiner* — Tuan T Dinh
(74) *Attorney, Agent, or Firm* — Brownstein Hyatt Farber Schreck, LLP

(57) ABSTRACT

Differentially strengthened cover members for electronic devices are disclosed. The differentially strengthened cover members include at least one chemically strengthened zone that improves the resistance of the cover member to cracking. In some examples, one or more of the chemically strengthened zones covers or at least partially surrounds a portion of the cover member to be protected from damage.

20 Claims, 18 Drawing Sheets

(56) References Cited

U.S. PATENT DOCUMENTS

| | | |
|---|---|---|
| 2010/0285260 A1 | 11/2010 | Bookbinder et al. |
| 2011/0019123 A1 | 1/2011 | Prest et al. |
| 2011/0154861 A1 | 6/2011 | Kishimoto et al. |
| 2012/0194974 A1 | 8/2012 | Weber et al. |
| 2012/0236526 A1 | 9/2012 | Weber et al. |
| 2013/0122254 A1 | 5/2013 | Liang |
| 2013/0122260 A1 | 5/2013 | Liang |
| 2014/0034374 A1 | 2/2014 | Cornejo et al. |
| 2014/0078412 A1 | 3/2014 | Franklin et al. |
| 2014/0111954 A1 | 4/2014 | Lee et al. |
| 2014/0162029 A1 | 6/2014 | Takeuchi et al. |
| 2014/0193606 A1* | 7/2014 | Kwong ............... C04B 41/0081 428/218 |
| 2014/0370244 A1 | 12/2014 | Kinoshita et al. |
| 2015/0044445 A1 | 2/2015 | Garner et al. |
| 2015/0147538 A1 | 5/2015 | Ishimaru et al. |
| 2015/0248142 A1 | 9/2015 | Qian et al. |
| 2015/0274585 A1 | 10/2015 | Rogers et al. |
| 2016/0326050 A1 | 11/2016 | Lee et al. |
| 2016/0357294 A1* | 12/2016 | Ozeki .................... B32B 17/06 |
| 2017/0197870 A1* | 7/2017 | Finkeldey ................ C03C 4/18 |
| 2017/0291849 A1* | 10/2017 | Dejneka ................. C03C 3/093 |
| 2017/0334770 A1* | 11/2017 | Luzzato ................ C03C 21/005 |
| 2018/0009706 A1 | 1/2018 | Luo et al. |
| 2018/0016188 A1 | 1/2018 | Gamer et al. |
| 2018/0086663 A1* | 3/2018 | Luzzato .................. C03B 23/03 |
| 2019/0161401 A1 | 5/2019 | Kuang et al. |
| 2019/0276356 A1* | 9/2019 | Abbott .................... C03C 19/00 |
| 2019/0330103 A1* | 10/2019 | Ozeki .................... C03C 3/091 |
| 2020/0017406 A1* | 1/2020 | Wilson ................. G06F 1/1656 |
| 2020/0199020 A1* | 6/2020 | Hatano ................ C03C 21/002 |
| 2020/0201397 A1* | 6/2020 | DeMartino ............... G06F 1/16 |
| 2020/0389991 A1* | 12/2020 | Shannon ............. H04M 1/0264 |
| 2021/0072789 A1* | 3/2021 | Rogers ..................... G02B 1/14 |
| 2021/0139371 A1 | 5/2021 | Luzzato et al. |
| 2023/0002273 A1 | 1/2023 | Davis et al. |
| 2023/0167021 A1 | 6/2023 | Luzzato et al. |
| 2023/0303434 A1 | 9/2023 | Wilson et al. |

FOREIGN PATENT DOCUMENTS

| | | |
|---|---|---|
| CN | 102388003 | 3/2012 |
| CN | 102421597 | 4/2012 |
| CN | 102557467 | 7/2012 |
| CN | 102612500 | 7/2012 |
| CN | 103261112 | 8/2013 |
| CN | 103391903 | 11/2013 |
| CN | 103476727 | 12/2013 |
| CN | 103748047 | 4/2014 |
| CN | 104144877 | 11/2014 |
| CN | 105683118 | 6/2016 |
| CN | 105705467 | 6/2016 |
| CN | 105873871 | 8/2016 |
| CN | 106061913 | 10/2016 |
| CN | 106164004 | 11/2016 |
| CN | 106380087 | 2/2017 |
| CN | 106673458 | 5/2017 |
| CN | 107117810 | 9/2017 |
| DE | 102012213071 | 7/2013 |
| JP | 2000233949 | 8/2000 |
| JP | 2004510012 | 4/2004 |
| JP | 2005298312 | 10/2005 |
| JP | 2009234856 | 10/2009 |
| JP | 2014510012 | 4/2014 |
| JP | 2015006959 | 1/2015 |
| JP | 2017030997 | 2/2017 |
| JP | 2018168030 | 11/2018 |
| KR | 20170033209 | 3/2017 |
| TW | 201819327 | 6/2018 |
| WO | WO2013/088910 | 6/2013 |
| WO | WO2015/031151 | 3/2015 |
| WO | WO2015/057552 | 4/2015 |
| WO | WO2015130494 | 9/2015 |
| WO | WO2015/146169 | 10/2015 |
| WO | WO2016/149860 | 9/2016 |
| WO | WO2016/172292 | 10/2016 |
| WO | WO2017/026190 | 2/2017 |
| WO | WO2018/066314 | 4/2018 |
| WO | WO2018/116981 | 6/2018 |

* cited by examiner

ELECTRONIC DEVICES HAVING DIFFERENTIALLY STRENGTHENED COVER MEMBERS

CROSS-REFERENCE TO RELATED APPLICATION(S)

This application is a nonprovisional application of and claims the benefit of U.S. Provisional Patent Application No. 63/300,984, filed Jan. 19, 2022 and titled "Electronic Devices Having Differentially Strengthened Cover Members," the disclosure of which is hereby incorporated herein by reference in its entirety.

FIELD

The described embodiments relate generally to strengthened covers for electronic devices. More particularly, the present embodiments relate to cover members that are chemically strengthened to include at least one portion that is chemically strengthened to a greater extent than an adjacent portion of the cover member.

BACKGROUND

Conventional cover members for portable electronic devices may be made of glass and in some cases may be provided over a display. Conventional glass cover members may be chemically strengthened by substantially uniform ion exchange over the entire surface. Such uniformly strengthened glass cover members may have symmetric compressive stress regions at the front and rear surfaces, with a region of tensile stress between the compressive stress regions.

SUMMARY

Aspects of the following disclosure relate to cover members for electronic devices that are differentially strengthened. The cover member may be part of an enclosure of the electronic device and may be positioned over a display or another component of the electronic device. The differential strengthening of the cover member may provide improved crack resistance to a portion of the cover member that is strengthened to a greater extent. Additional aspects of the disclosure relate to enclosures and electronic devices including the cover members described herein.

In embodiments, the differentially strengthened cover members include at least one chemically strengthened zone that is chemically strengthened to a greater extent than another chemically strengthened zone. The zone of the cover member that has the greater extent of chemical strengthening may have greater crack resistance than the other zone. In some cases, the zone of the cover member having the greater extent of chemical strengthening defines a compressive stress profile extending through a thickness of the cover member.

In some cases, the zone of the cover member that has the greater extent of chemical strengthening includes a window portion of the cover member, with the window portion being positioned over an optical component. The greater extent of chemical strengthening provided to the window portion may help prevent propagation of a crack through the window portion.

In additional cases, one or more chemically strengthened zones of the cover member that have a greater extent of chemical strengthening at least partially surround another chemically strengthened zone of the cover member. For example, the cover member may include a window portion and a set of barrier portions arranged at least partially around the window portion. The set of barrier portions includes a chemically strengthened zone having a greater extent of chemical strengthening than an adjacent chemically strengthened zone. In some cases, one or more of the barrier portions have a compressive stress region that extends through the thickness of the cover member. In some cases, the set of barrier portions may define a barrier that helps to block propagation of a crack from a periphery of the cover member towards the window portion. In additional cases, the set of barrier portions may be positioned at a thinner portion of the cover member to provide additional protection against cracking to the thinner portion.

The disclosure provides an electronic device comprising an enclosure comprising a cover member defining an exterior surface and an interior surface. The cover member comprises a first chemically strengthened zone defining a first stress profile comprising a first region of compressive stress extending from the exterior surface to the interior surface and a second chemically strengthened zone surrounding the first chemically strengthened zone and defining a second stress profile. The second stress profile comprises a second region of compressive stress extending from the exterior surface, a third region of compressive stress extending from the interior surface, and a region of tensile stress between the second and the third regions of compressive stress.

The disclosure also provides an electronic device comprising a display and an enclosure at least partially surrounding the display and including a cover member. The cover member comprises a window portion positioned over the display and having a window stress profile comprising an exterior compressive stress region extending from an exterior surface of the cover member, an interior compressive stress region extending from an interior surface of the cover member, and a tensile stress region positioned between the exterior and the interior compressive stress regions, and a set of barrier portions arranged at least partially around the window portion, each barrier portion of the set of barrier portions having a respective barrier stress profile comprising a compressive stress region extending from the exterior surface of the cover member to a depth that is greater than a depth of the exterior compressive stress region of the window stress profile.

The disclosure further provides an electronic device comprising an optical component and an enclosure comprising a cover member. The cover member comprises a first chemically strengthened zone positioned over the optical component and defining a first stress profile including a compressive stress region extending from an exterior surface of the cover member to a first depth. The cover member also comprises a second chemically strengthened zone surrounding the first chemically strengthened zone and defining a second stress profile comprising an exterior compressive stress region extending from an exterior surface of the cover member to a second depth less than the first depth, an interior compressive stress region extending from an interior surface of the cover member, and a tensile stress region positioned between the exterior and the interior compressive stress regions.

BRIEF DESCRIPTION OF THE DRAWINGS

The disclosure will be readily understood by the following detailed description in conjunction with the accompanying drawings, wherein like reference numerals designate like elements.

Figure 1A:
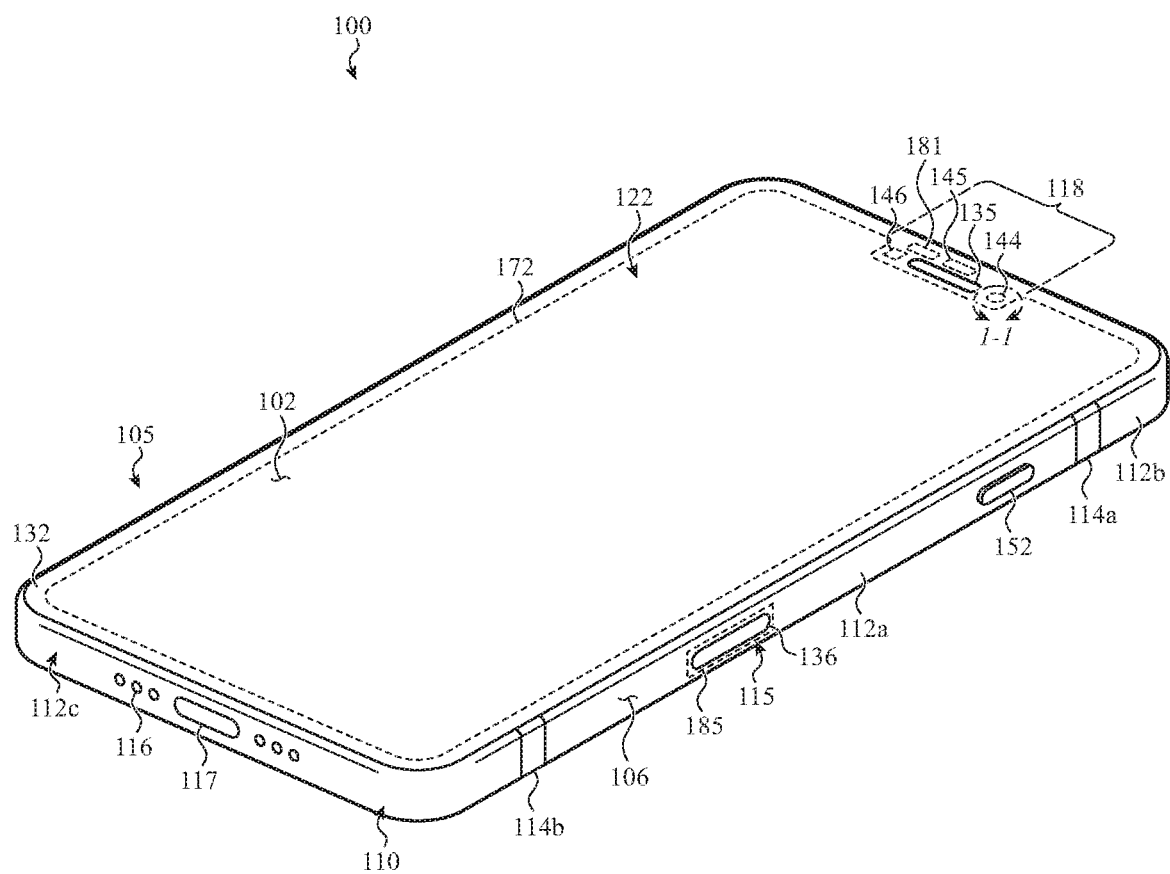
FIG. 1A shows a front view of an example electronic device including a differentially strengthened cover member.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The following disclosure relates to cover members for electronic devices that are differentially strengthened. As used herein, the term "differentially strengthened" may be used to refer to a glass or glass ceramic article having differently strengthened zones. The cover member may be part of an enclosure of the electronic device and may be positioned over a display or another component of the electronic device. The differential strengthening of the cover member may provide improved crack resistance to a portion of the cover member that is strengthened to a greater extent. Additional aspects of the disclosure relate to enclosures and electronic devices including the cover members described herein.

In embodiments, the differentially strengthened cover members include at least one chemically strengthened zone that is chemically strengthened to a greater extent than another chemically strengthened zone. The zone of the cover member that has the greater extent of chemical strengthening may have greater crack resistance than the other zone. The zone of the cover member having a greater level of chemical strengthening may also help to arrest or redirect crack propagation within the cover in order to reduce the probability that a crack will propagate across functional areas of the cover like a camera area, sensor area, or display area. The zone that is chemically strengthened to a greater extent may have a greater depth of compression (e.g., a maximum depth of compression), a greater maximum compressive stress, and/or a greater surface compressive stress. In some cases, the zone of the cover member having the greater extent of chemical strengthening defines a compressive stress profile extending through the thickness of the cover member. In other cases, the zone of the cover member having the greater extent of chemical strengthening defines a stress profile that includes an internal region that includes both compressive and tensile stress regions, but that is different from the stress profile of a zone having a lesser extent of chemical strengthening. The description of exemplary stress profiles provided with respect to FIGS. 3A through 5B and 7 through 8B are generally applicable herein. Each of the zones may be chemically strengthened through ion exchange, as is described in more detail with respect to at least FIGS. 2A-2B and 9 through 12D.

In some cases, the chemically strengthened zone of the cover member that has the greater extent of chemical strengthening includes a window portion of the cover member, with the window portion being positioned over an optical component. The greater extent of chemical strengthening provided to the window portion may help prevent propagation of a crack through the window portion. A lateral dimension of a chemically strengthened zone that covers an optical component may depend upon the lateral dimension of the optical component. In some cases, the lateral dimension of the chemically strengthened zone that includes a window portion (e.g., a diameter) is from about 1 mm to about 5 mm.

In some cases, one or more chemically strengthened zones of the cover member that have a greater extent of chemical strengthening at least partially surround another chemically strengthened zone of the cover member. For example, the cover member may include a window portion and one or more barrier portions arranged at least partially around the window portion. Each of the barrier portions may be located outside of an active display region of a display. In some cases, each barrier portion of the set of barrier portions is positioned over an opaque coating along the interior surface of the cover member (which may mask non-active regions of the display). The set of barrier portions includes a chemically strengthened zone having a greater extent of chemical strengthening than an adjacent (e.g., an abutting) chemically strengthened zone. In some cases, one or more of the barrier portions have a compressive stress region that extends through the thickness of the cover member. In examples, the set of barrier portions may define a ring around the window portion or another form of barrier that helps to block propagation of a crack from a periphery (e.g., an edge) of the cover member towards the window portion. The barrier portions may be offset from an edge of the cover member. In some cases, a lateral dimension of a chemically strengthened zone (e.g., a diameter) within a barrier portion is from about 100 micrometers to about 1 cm, from about 500 micrometers to about 5 mm, or from about 500 micrometers to about 3 mm.

In some cases, the electronic device includes a sensor assembly or a camera assembly that comprises multiple optical components. For example, the sensor assembly may be an optical facial recognition sensor that includes an optical flood emitter, a point source emitter, and an optical detector. In some examples, the cover member includes two or more window portions positioned over the multiple optical components of a sensor assembly, each of these window portions having a greater extent of chemical strengthening than an adjacent portion of the cover member. In additional examples, the cover assembly may include barrier portions arranged around the multiple optical components of the sensor assembly, each of the barrier portions having a greater extent of chemical strengthening than an adjacent portion of the cover member. The barrier portions may define a single ring or separate rings around the optical components.

These and other embodiments are discussed below with reference to FIGS. 1A-13. However, those skilled in the art will readily appreciate that the detailed description given herein with respect to these figures is for explanatory purposes only and should not be construed as limiting.

FIG. 1A shows a front view of an example of an electronic device including a differentially strengthened cover member. The electronic device may have an enclosure 105 including a differentially strengthened cover member, as described herein. The electronic device 100 may be a mobile telephone (also referred to as a mobile phone). In additional embodiments, the electronic device 100 may be a notebook computing device (e.g., a notebook or laptop), a tablet computing device (e.g., a tablet), a portable media player, a wearable device, or another type of portable electronic device. The electronic device 100 may also be a desktop computer system, computer component, input device, appliance, or virtually any other type of electronic product or device component.

As shown in FIG. 1A, the electronic device 100 comprises an enclosure 105 including an enclosure component 110 and a cover 122. The cover 122 may define at least a portion of the front surface 102 and of the electronic device and may be referred to as a front cover. The enclosure 105 further includes a cover 124 (shown in FIG. 1B) which defines at least a portion of a rear surface 104 of the electronic device and which may be referred to as a rear cover. In embodiments, the cover 122 and/or the cover 124 includes a differentially strengthened cover member, as described herein.

Figure 1B:
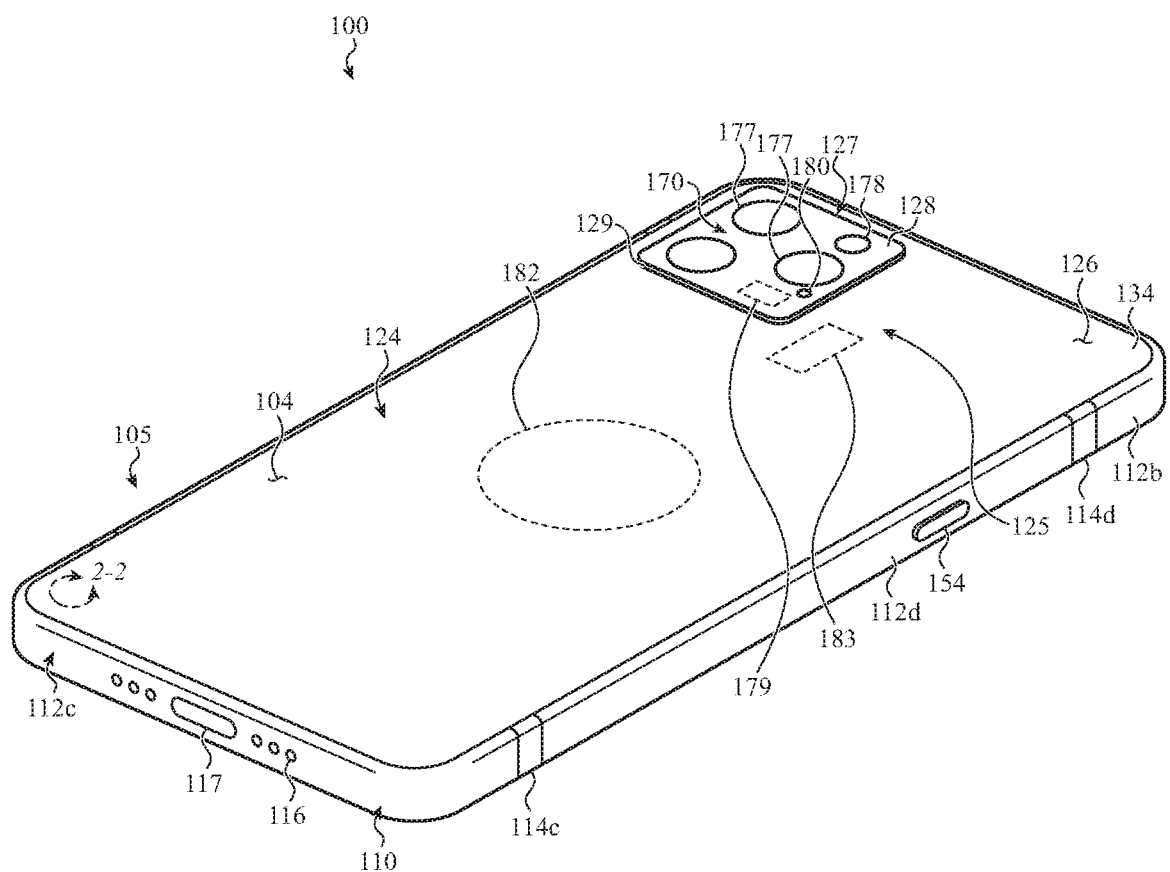
FIG. 1B shows a rear view of the electronic device of FIG. 1A
Figure 6A:
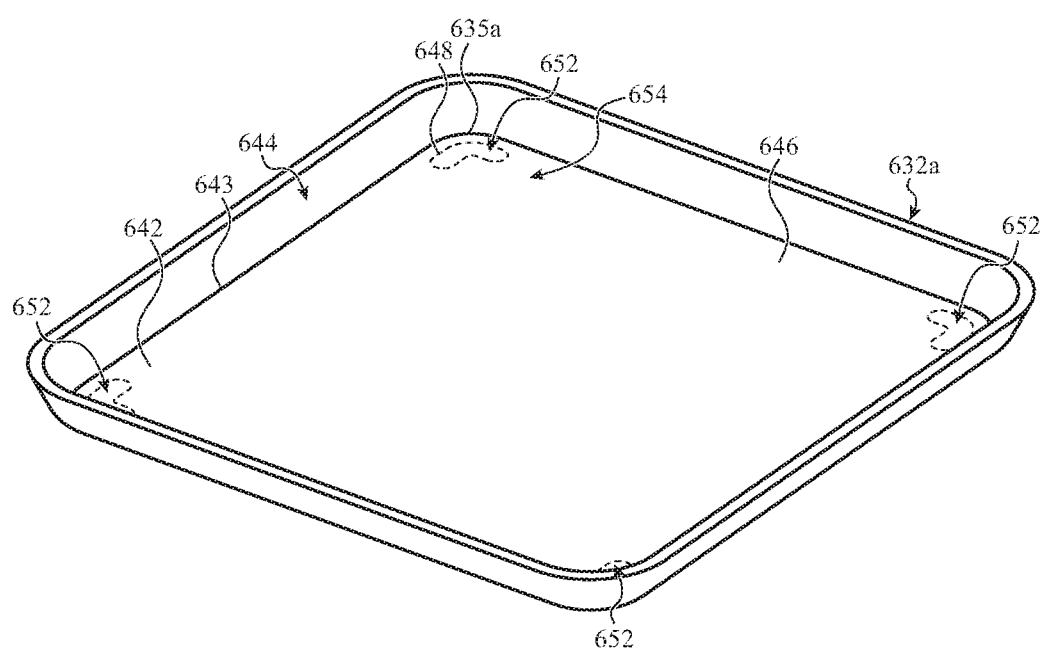
FIGS. 6A, 6B, and 6C show examples of cover members.

In embodiments, the cover 122 and/or the cover 124 may have the form of a substantially flat sheet or may define a contoured profile. The cover member may be shaped similarly to its respective cover. For example, the cover 122 and/or the cover 124 may define a peripheral portion that is not coplanar with respect to a central portion. In some cases, the peripheral portion may define a side wall of the enclosure while the central portion defines a front surface. An example of a cover member having this shape is shown in FIG. 6A. As an additional example, a cover such as the cover 124 may define a surface protrusion (as shown in FIG. 1B), a surface recess, and/or one or more curved surfaces. The one or more curved surfaces in some cases may be defined by a bend in the cover and/or at an edge extending between front and rear surfaces of the cover. In embodiments. the cover such as the cover 122 or 124 may have a substantially uniform thickness or may vary in thickness. For example, the portion 127 of the cover 124 may be thicker than another portion 125. The portion 127 defines a top surface 128 and the side surface 129 while the portion 125 defines the surface 126.

In some embodiments, the cover 122 and/or the cover 124 defines a window over an optical component or a sensor. In additional embodiments, the cover 122 and/or the cover 124 defines one or more through-holes extending through its thickness to facilitate positioning of one or more device components. For example, the cover may define a through-hole used for positioning of a component such as an optical component or another type of sensor. In some cases, the front cover 122 may define an opening, such as the opening 135, which may be positioned over a speaker or another internal device. The cover 124 of FIG. 1B may define one or more through-holes to allow positioning of the optical components (e.g., the optical component 177).

The cover 122 includes a cover member 132, which may be referred to as a front cover member and the cover 124 includes a cover member 134, which may be referred to as a rear cover member. Each of the covers 122 and 124 may also include one or more coatings applied to its respective cover member. For example, an anti-reflection and/or smudge-resistant coating may be applied to an exterior surface of a cover member. As an additional example, a masking or decorative coating may be applied to an interior surface of a cover member. The masking layer may be substantially opaque and may have an optical density of 3 or more. In a further example, one or more of the covers 122 and 124 may include a structure along an interior surface of the cover to provide structural support/reinforcement, an electrical function, a thermal function, and/or a decorative effect. As examples, the structure may be formed of a polymer, a laminate, or a metal material. When the cover has a three-dimensional shape, the structure may conform to a three-dimensional portion of the cover.

The cover members 132 and 134 may extend laterally across their respective covers, such as substantially across the width and the length of the covers 122 and 124. In some examples, the cover member 132 has a thickness from about 0.3 mm to about 0.75 mm or from about 0.5 mm to about 1 mm. In some cases, the cover member 134 varies in thickness. For example, a thinner portion of the cover member may have a thickness greater than about 0.2 mm and less than about 0.75 mm or from about 0.5 mm to about 1 mm and the thicker portion of the cover member may have a thickness greater than about 1 mm and less than or equal to about 2 mm or about 2.5 mm. In some cases, a window portion of the cover member may have sufficient transmittance and clarity for use over an optical component of the electronic device.

In additional embodiments, an electronic device may include a unitary cover member formed from a single piece of material (rather than the separate cover members 122 and 124 coupled to the enclosure component 110). Such a unitary cover member may also be referred to as a monolithic cover member.

Figure 2A:
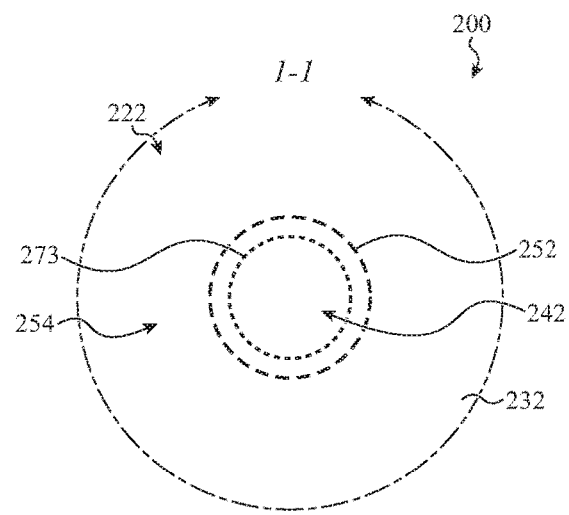
FIG. 2A shows a detail view of an example electronic device.
Figure 2B:
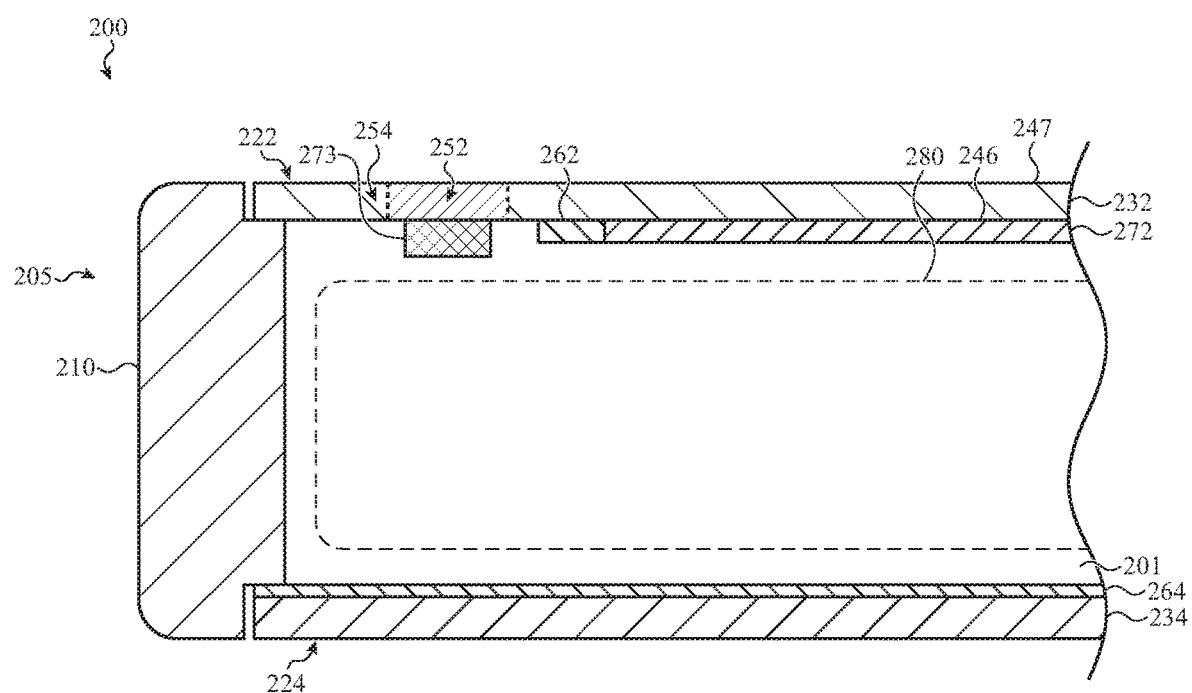
FIG. 2B shows a partial cross-section view of the example electronic device of FIG. 2A.

One or more of the cover members 132 and 134 may include or may be formed of an ion-exchangeable material. For example, the ion-exchangeable material may be an ion-exchangeable glass, an ion-exchangeable glass ceramic, or a combination thereof. The additional description provided of ion-exchangeable materials with respect to FIGS. 2A and 2B is generally applicable herein and is not repeated here.

In the example of FIG. 1A, the electronic device includes a display 172 that is at least partially enclosed or surrounded by the enclosure 105. As shown in FIG. 1A, the cover 122 is positioned over the display 172 and may define a window over the display 172. The cover 122 may be coupled to the display. The cover 122 may also be integrated with or coupled to a touch sensor that is configured to detect or estimate a location of a touch along the exterior surface of the cover 122. The touch sensor may be associated with planar and/or non-planar regions of the cover 122. For example, the touch sensor may include an array of capacitive electrodes that are positioned below the cover 122 and, in some instances, may be integrated with the display. In some cases, the display may also be at least partially enclosed or surrounded by the enclosure component 110, which may also be referred to as a housing.

The electronic device may also include one or more front-facing and/or rear-facing components such as sensors, cameras, and the like. In the example of FIG. 1A, the device 100 includes a front-facing optical component and the cover 122 (and the cover member 132) defines a window over this optical component. The optical component may be part of a sensor assembly, a camera assembly, or the like. Sensor assemblies, sensor arrays, and camera assemblies are described in further detail below and with respect to FIG. 13 and that description is not repeated here. In additional examples, the display maybe be considered an optical component.

The enclosure member 110 may at least partially define a side surface 106 of the electronic device 100 and may include one or more metal members, one or more glass members, or one or more glass ceramic members. Each of the glass members may be a differentially strengthened member as described herein. In the example of FIG. 1A, the enclosure member 110 defines all four sides or a continuous side surface 106 of the electronic device 100. FIG. 1B shows a rear view of the electronic device of FIG. 1A. In some cases, the enclosure member 110 is formed from a series of segments formed from a metal (112a, 112b, 112c, and 112d) that are separated by dielectric segments (114a, 114b, 114c, and 114d) that provide electrical isolation between adjacent metal segments. For example, a dielectric segment (114b) may be provided between a pair of adjacent segments formed from a metal (112a, 112c). One or more of the segments formed from a metal may be coupled to internal circuitry of the electronic device 100 and may function as an antenna for sending and receiving wireless communication. The segments may be formed from an aluminum alloy, a titanium alloy, steel, a magnesium alloy or other suitable metal materials. As used herein, a member or component that is formed from a metal may include a surface coating that is not metallic, such as an anodization layer. The dielectric segments may be formed from one or more dielectric materials such as a polymer, a glass, or a ceramic material. In additional embodiments, the enclosure member 110 may be positioned internal to the electronic device 100 and one or more of the cover 122 or the cover 124 may define all or most of the side surface 106 of the electronic device.

The enclosure component 110 may define one or more openings or ports. In the example of FIGS. 1A and 1B, the metal segment 112c of the enclosure component 110 defines the openings 116 and 117. The opening 116 may allow (audio) input or output from a device component such as a microphone or speaker. The opening 117 may contain an electrical port or connection. In addition, the electronic device 100 may include one or more input devices. In the example of FIGS. 1A and 1B, the input devices 152 and 154 have the form of a button and may extend through additional openings in the enclosure component 110. In some cases, the electronic device 100 also includes a support plate and/or other internal structural components that are used to support internal electronic circuitry or electronic components.

In some cases, the enclosure component 110 may include one or more members 115 positioned within a metal member (e.g., 112a). In some cases, the member 115 may provide a window for the device component 185, may define a portion of a waveguide, and/or allow for beam-forming or beam-directing functionality. The member 115 may include a cover member 136 as shown in the example of FIG. 1A. For example, the member 115 may define an antenna window for transmitting and receiving wireless signals. The member 115 may be configured to transmit wireless signals at one or more of the frequencies previously discussed with respect to the device components 181, 183, and 185. For example, the member 115 may be configured to transmit wireless signals at a frequency band between about 25 GHz and about 39 GHz.

In embodiments, the electronic device 100 includes multiple sensing arrays. As referred to herein, a sensing array may include one or more camera assemblies (e.g., a camera array), one or more sensor assemblies (e.g., a sensor array), an illumination assembly, or combinations of these. The front sensing array 118 includes a front-facing camera assembly 144 and a front-facing sensor assembly 146. The front sensing array may also include another sensor assembly 145, which in some cases may be an ambient light sensor. The rear sensing array 170 includes an array of rear-facing camera assemblies and at least one sensor assembly as described in more detail below. An illumination assembly typically includes a light source such as a flood light source or other emitter which enables various sensing modes like face recognition and digital photography. For example, one or more emitters may emit an array of beams that are reflected off various parts of the face. The reflected beams can be used to create a point or depth map of the face and used to authenticate a user.

The sensing array may include one or more optical components, which may also be referred to herein as an optical module. An optical component may include one or more of a photodetector and/or image sensor, associated electronics, one or more optical lenses, optical covers, barrels, shrouds, and associated optical elements. For example, the optical component may be a camera component, an illumination component, or a sensor component. The sensing array may define any number of optical components such as one, two, three, four, five, or six optical components.

As shown in FIGS. 1A and 1B, the electronic device 100 includes multiple camera assemblies. For example, the electronic device 100 may include a front-facing camera assembly 144 and a rear-facing camera array. Each camera assembly may include a camera component (e.g., the optical component 177 shown in FIG. 1B). An array of camera assemblies (also referred to herein as a camera array) typically includes multiple camera components and one or more illumination components. When the camera array includes multiple camera components, each of the camera components may have a different field of view or other optical property. For example, a camera component may be configured to produce an image from visible light or infrared light. The multiple camera components may be also referred to as a set of camera components and in some cases may form an array of camera components. In some cases, a camera component includes an optical sensor array and/or an optical component such as a lens, filter, or window. In additional cases, a camera component includes an optical sensor array, an optical component, and a camera housing surrounding the optical sensor array and the optical components. The camera component may also include a focusing assembly. For example, a focusing assembly may include an actuator for moving a lens of the camera component. In some cases, the optical sensor array may be a complementary metal-oxide semiconductor (CMOS) array or the like.

The electronic device 100 may include one or more sensor assemblies. As shown in FIG. 1A, the electronic device 100 includes one or more front-facing sensor assemblies 146. The device 100 also includes one or more rear-facing sensor assemblies as described in more detail with respect to FIG. 1B. A sensor assembly may also be referred to herein simply as a sensor. Examples of sensor (assemblies) include, but are not limited to, a proximity sensor, a light sensor (e.g., an ambient light sensor), a biometric sensor (e.g., a face or fingerprint recognition sensor or a health monitoring sensor), a depth sensor, or an imaging sensor. Other examples of sensors include a microphone or a similar type of audio sensing device, a radio-frequency identification chip, a touch sensor, a force sensor, an accelerometer, a gyroscope, a magnetometer such as a Hall-effect sensor or other magnetic sensor, or similar types of position/orientation sensing devices. When the sensor is an optical sensor, the sensor may operate over a particular wavelength range such as a visible, an infrared, or an ultraviolet wavelength range. In some cases, the optical sensor is a reflectance sensor. The electronic device may further include a processing unit (also, processor) that computes a value based on a signal from the sensor.

Figure 13:
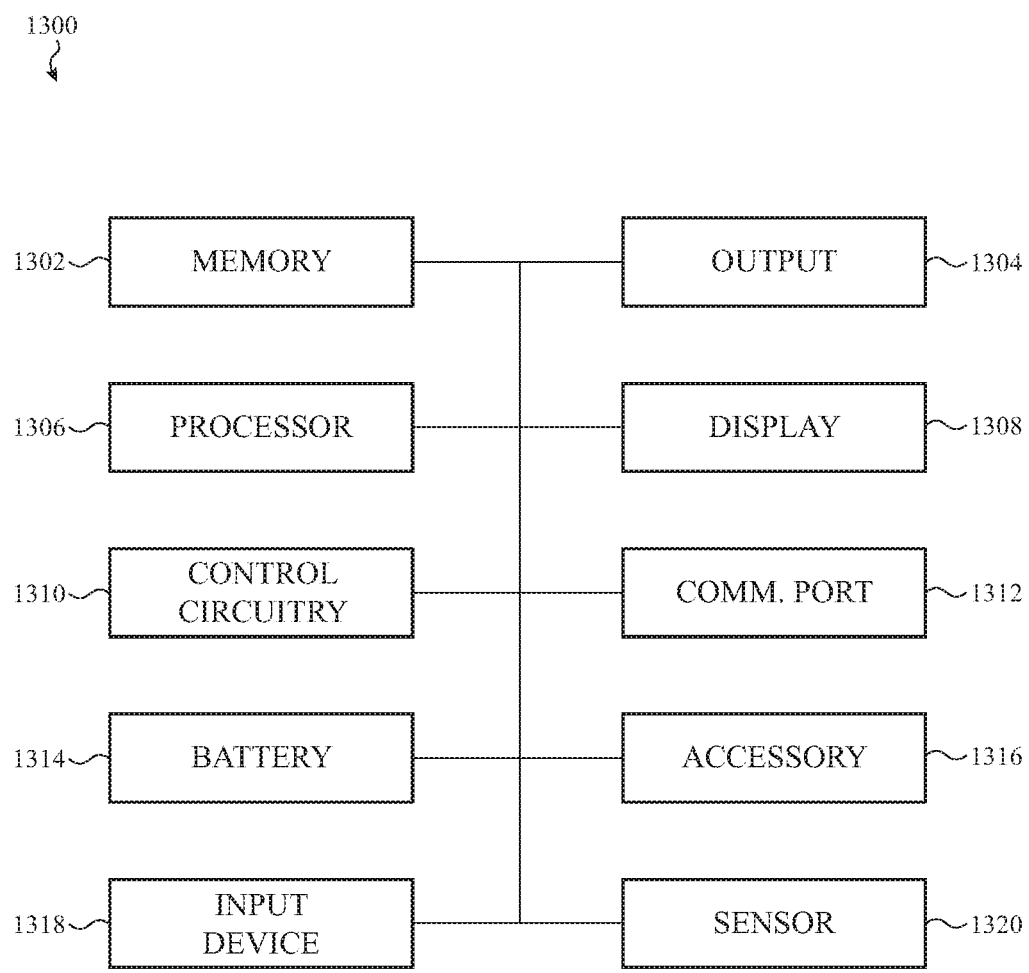
FIG. 13 shows a block diagram of a sample electronic device that can include a differentially strengthened cover member.

In some cases, one or more sensors may be grouped with one or more camera assemblies. As examples, the one or more sensors may be a depth measuring sensor (e.g., a time of flight sensor), an ambient light sensor, a facial recognition sensor, an infrared sensor, an ultraviolet light sensor, a health monitoring sensor, a biometric sensor (e.g., a fingerprint sensor) or the like. These sensors may be provided proximate to one or more optical components of a camera array, as shown in FIG. 1B. The additional description of sensor assemblies, camera assemblies, and processors provided with respect to FIG. 13 is generally applicable herein.

In addition, the electronic device 100 may include one or more device components that may be part of a wireless communication system, such as the device components 181, 183, and 185. As examples, the wireless communication system may be an RF or an IR communication system. In some cases, the device components 181, 183, and 185 are wireless transmission modules that may include one or more antenna assemblies, also referred to herein simply as antennas. As previously discussed, a component of an RF communication system may include an RF antenna configured to radiate a radio-frequency (RF) signal. The RF antenna may be configured to operate at one or more desired RF frequency ranges or RF frequency bands. As examples, an RF communication system may operate at a frequency range such as a "low band" frequency range (e.g., less than 1 GHz, such as about 400 MHz to less than 1 GHz, about 600 MHz to about 900 MHz, or 600 MHz to 700 MHz), a "mid-band" frequency range (e.g., about 1 GHz to about 6 GHz, such as about 1 GHz to about 2.6 GHz, about 2 GHz to about 2.6 GHz, about 2.5 GHz to about 3.5 GHz, or about 3.5 GHz to about GHz), or a "high-band" frequency range (e.g., about 24 GHz to about 40 GHz, about 57 GHz to about 64 GHz, or about 64 GHz to about 71 GHz). Wireless communication protocol and standards may include established protocols and standards such as IEEE 802.11x, GSM, LTE, CDMA, TDMA, 3G, 4G, 5G, Bluetooth, Bluetooth Low Energy (BLE), ISO/IEC 18000-3, Wi-Fi, Radio-frequency identification (RFID), Near-Field Communication (NFC), Global Positioning System (GPS), or any other target wireless communication protocol or standard (including yet-to-be-developed protocols and/or standards).

In some cases, the electronic device 100 may include one or more groups of antennas that include elements that are configured to communicate via a 5G wireless protocol (including millimeter wave and/or 6 GHz communication signals). 5G communications may be achieved using various different communications protocols. For example, an antenna element may operate at a 24 GHz to 39 GHz frequency band or a 60 GHz frequency band (e.g., 57-64 GHz or 64-71 GHz). Further the particular frequency band of any given 5G implementation may differ from others. For example, different wireless communications providers may use different frequency bands in the millimeter-wave spectrum (e.g., one provider may implement a 5G communications network using frequencies around 28 GHz, while another may use frequencies around 39 GHz). The antenna group(s) may be configured to allow communications via one or multiple of the frequency bands that implement 5G communications.

In some cases, the electronic device 100 includes one or more directional antennas (or high gain antennas). Accordingly, the antenna gains of the directional antennas may be highest along particular directions. A directional antenna may include an array of transceiver elements that are used to form the shapes and orientations of the radiation patterns (or lobes) of the antenna, which may be a millimeter wave antenna. The electronic device 100 may include multiple directional antennas which have different primary transmission directions.

For example, the sensing array 170 may include multiple camera assemblies. Each of the camera assemblies may include an optical component such as the optical component 177 or the optical component 178. The optical component 177 may be positioned at least partially within an opening in the portion 127. The optical component 177 may be a camera component while the optical component 178 may be an illumination component.

In addition, the sensing array 170 may include one or more sensor assemblies, such as the sensor assembly 179. In some embodiments, the sensor assembly 179 may include one or more optical components. For example, the sensor assembly may include an emitter component, a receiver component, or both. In some cases, the sensor assembly 179 may measure a distance to a target, such as a Lidar sensor assembly which is configured to illuminate an object with light and then detect the reflected light to determine or estimate the distance between the electronic device and the object (e.g., a time of flight (TOF) sensor). In some examples the sensor assembly 179 may be positioned below the cover member 134 (and the cover member 134 may act as a window for the sensor assembly 179). In these examples, the optical properties of the cover member 134 may be suitable for use over one or more optical components of the sensor assembly. For example, the one or more optical components may operate over one or more specified wavelength ranges and the cover member 134 may be configured to have a suitable transmission/transmittance over these wavelength ranges. In other examples, the cover member 134 may define an opening over the sensor assembly and an additional cover member may be placed in or over the opening (and act as a window for the sensor assembly).

The portion 127 may also include a sensor assembly 180 which is other than an optical component. For example, the sensor assembly 180 may be a microphone which may be positioned at least partially within or below an opening in the portion 127. In implementations in which the portion 127 is used to protect one or more sensor components or components, the portion 127 and/or the protruding region of the portion 127 may be referred to as a sensor feature, a camera feature, a sensing array, a camera panel, and/or a camera bump.

The electronic device 100 may comprise one or more of a processing unit, control circuitry, memory, an input/output device, a power source (e.g., battery), a charging assembly (e.g., a wireless charging assembly), a network communication interface, an accessory, and a sensor. In the example of FIG. 1B, the rear cover assembly 124 is positioned over the device component 182, which may be a wireless charging component. Components of a sample electronic device are discussed in more detail below with respect to FIG. 13 and the description provided with respect to FIG. 13 is generally applicable herein.

FIG. 2A shows an example of an enlarged top view of an electronic device and may show an example of detail area 1-1 of FIG. 1A. In the example of FIG. 2A, the electronic device 200 includes an optical component 273 positioned under the cover 222 and indicated with dashed lines. The cover 222 includes a cover member 232 and the portion 242 of the cover member 232 defines a window for the optical component 273. The portion 242 of the cover member may therefore be referred to as a window portion. The optical component 273 may be an optical component of a camera assembly, a sensor assembly, or the like.

The enlarged view of FIG. 2A shows two chemically strengthened zones 252 and 254. The boundary of the zone 252 is shown with dashed lines. The chemically strengthened zone 252 is surrounded by the chemically strengthened zone 254. In the example of FIG. 2A, the chemically strengthened zone 252 includes the window portion 242 and extends beyond the window portion 242 at the exterior surface of the cover member 232. In additional examples, the location of the chemically strengthened zone 252 may substantially correspond to the location of the window portion 242. The shape of the chemically strengthened zone 252 shown in FIG. 2A is generally circular at the exterior surface of the cover member 232. The shape of the chemically strengthened zone 252 shown in FIG. 2A is exemplary rather than limiting and the chemically strengthened zone may define a shape at the exterior surface that is circular, oval, includes multiple lobes, or another suitable shape suitable for covering an optical component.

In the example of FIG. 2A, the chemically strengthened zone 252 is chemically strengthened to a different extent than the chemically strengthened zone 254. For example, the chemically strengthened zone 252 may be chemically strengthened to a greater extent than the chemically strengthened zone 254 and may be configured to protect the window portion 242 from cracking in the event of damage to the cover member.

For example, a chemically strengthened zone 252, which is chemically strengthened to a greater extent, may have a greater depth of compression, a greater maximum compressive stress, and/or a greater surface compressive stress than the chemically strengthened zone 254. In some cases, the chemically strengthened zone 252 is in compression through a thickness of the cover member and defines a compressive stress profile extending through the thickness and the chemically strengthened zone 254 includes an internal region that is in tension and defines a stress profile that includes both compressive and tensile stress regions, as schematically illustrated in the cross-section view of FIG. 7. In embodiments, the maximum compressive stress in the chemically strengthened zone 252 is greater than the maximum compressive stress in the chemically strengthened zone 254. For example, the maximum compressive surface stress of the chemically strengthened zone 252 may be greater than the maximum compressive surface stress of the chemically strengthened zone 254. For example, the maximum compressive surface stress of the chemically strengthened zone 252 may be at least 5% or at least 10% greater than maximum compressive surface stress of the chemically strengthened zone 254. Each of the chemically strengthened zones 252 and 254 may be chemically strengthened through ion exchange, as described in more detail below and also with respect to at least FIGS. 9 through 12D.

FIG. 2B shows a partial cross-section view of the device of FIG. 2A. The device 200 includes an enclosure 205 and the enclosure 205 includes a front cover 222, a rear cover 224, and an enclosure component 210. The front cover 222 includes a cover member 232 and the rear cover 224 includes a cover member 234. The enclosure 205 defines an interior cavity 201 and the electronic device further 200 includes a display 272, and an optical component 273. The device 200 may also include additional components 280 positioned within the interior cavity, as indicated by the dashed line.

In the example of FIG. 2B, the cover member 232 is positioned over both the display 272 and the optical component 273. The cover member 232 includes the chemically strengthened zone 252 and the chemically strengthened zone 254. As previously described with respect to FIG. 2A, the chemically strengthened zone 252 is chemically strengthened to a different extent than the chemically strengthened zone 254. Additional description of differently chemically strengthened zones is provided with respect to at least FIGS. 7 through 8B and is not repeated here. Suitable materials for differentially strengthened cover members are described below and this description is generally applicable herein.

The chemically strengthened zone 252, which is positioned over the optical component 273 extends through a thickness of the cover member 232. The boundaries of the chemically strengthened zone 252 are shown with dashed lines. The depiction of the boundaries of the chemically strengthened zone 252 is exemplary rather than limiting and in additional examples the boundaries may be curved rather than straight. The chemically strengthened zone 252 is surrounded by the chemically strengthened zone 254. As previously shown and described with respect to FIG. 2A, the chemically strengthened zone 252 includes the window portion 242, which has not been shown in FIG. 2B for clarity of illustration.

The cover member 232 defines an exterior surface 247 and an interior surface 246. In some cases, the cover 222 includes a coating 262, which may be an opaque coating, along a portion of the interior surface 246. The coating 262 may be used to mask or obscure interior components of the electronic device from view. The cover 224 may also include a coating, such as the coating 264, along its interior surface. The coating 264 may serve to obscure interior components of the electronic device from view and may also provide a color or other decorative effect to the electronic device.

In some cases, the cover member 232 is formed from a glass material and may therefore be referred to as a glass cover member. Typically, a glass cover member is formed from a silica-based glass material. The glass material may have a network structure, such as a silicate-based network structure. As referred to herein, a "glass cover member," may include some relatively small amount of impurities or crystalline material, such as 1% or less, 2% or less, or 5% or less by weight of the member. In some embodiments, the glass material includes an aluminosilicate glass. As used herein, an aluminosilicate glass includes the elements aluminum, silicon, and oxygen, but may further include other elements. In some embodiments, the glass material includes a crystallizable glass material.

In embodiments, the glass material includes an ion-exchangeable glass material, such as an alkali metal aluminosilicate glass (e.g., a lithium aluminosilicate glass). An ion-exchangeable aluminosilicate glass may include monovalent or divalent ions that compensate for charges due to replacement of silicon ions by aluminum ions. Suitable monovalent ions include, but are not limited to, alkali metal ions such as $Li^+$, $Na^+$, or $K^+$. Suitable divalent ions include alkaline earth ions such as $Ca^{2+}$ or $Mg^{2+}$. In some embodiments, the glass material includes a crystallizable glass material.

In some cases, smaller ions in the glass material are exchanged for larger ions during the ion exchange process. For example, if the glass material comprises sodium ions, the sodium ions may be exchanged for potassium ions. Similarly, if the glass material comprises lithium ions, the lithium ions may be exchanged for sodium ions and/or potassium ions. As explained in more detail with respect to FIGS. 11 and 12A through 12C, in some cases the process of making a cover member may include an operation of exchanging larger ions in the glass material with smaller ions, which is followed by the operation of exchanging smaller ions in the glass material with larger ions. The ion exchange operations may take place at a temperature below a strain point of the glass material.

In additional cases, the cover member 232 may be formed of a glass ceramic material and may be referred to as a glass ceramic cover member. As referred to herein, a glass ceramic material comprises one or more crystalline phases (e.g., crystals) formed by crystallization of a (precursor) glass material. These crystalline phases can contribute to the favorable mechanical properties of the glass ceramic material. As referred to herein, a glass ceramic material comprises one or more crystalline phases (e.g., crystals) formed by crystallization of a (precursor) glass material. These crystalline phases can contribute to the favorable mechanical properties of the glass ceramic material.

By the way of example, the glass ceramic material may be an alkaline silicate, an alkaline earth silicate, an aluminosilicate, a boroaluminosilicate, a perovskite-type glass ceramic, a silicophosphate, an iron silicate, a fluorosilicate, a phosphate, or a glass ceramic material from another glass ceramic composition system. In some embodiments, the glass ceramic material comprises an aluminosilicate glass ceramic or a boroaluminosilicate glass ceramic. In addition to the principal elements of the glass ceramic material (e.g., aluminum, silicon, and oxygen for an aluminosilicate), the glass ceramic material may also include other elements. For example, the glass ceramic material (and the precursor glass) may include elements from nucleating agents for the glass ceramic material, such as a metal oxide (Ti, Zr) or other suitable oxide material. Aluminosilicate and boroaluminosilicate glass ceramics may further include monovalent or divalent ions, some of which may compensate charges due to introduction of aluminum ions in the material. For example, an aluminosilicate glass ceramic may include alkali metal ions such as $Li^+$ or $Na^+$.

Glass ceramic materials can form a variety of crystalline phases and glass ceramic materials useful for the cover members described herein which include one or more crystalline phases. For example, aluminosilicate glasses can form several types of crystalline phases, including β quartz solid solution crystals, keatite solid solution crystals (β spodumene solid solution crystals), petalite crystals, lithium disilicate crystals, and various other silicates. Other silicates include, but are not limited to, silicates including aluminum and optionally other elements such as lithium, sodium, potassium, and the like. Examples of such silicates include lithium orthoclase, lithium orthosilicate, (Li, Al, Na) orthosilicates (e.g., α or β eucryptite), and lithium metasilicate. Some of these crystalline phases can be transformed into other crystalline phases. For example, β quartz solid solution crystals can transform into keatite/β spodumene crystals. Similarly, mixtures of crystal phases can be transformed into different mixtures.

In embodiments, the glass ceramic cover member is capable of being chemically strengthened by ion exchange. For example, an ion-exchangeable glass ceramic material may include monovalent or divalent ions such as alkali metal ions (e.g., $Li^+$, $Na^+$, or $K^+$) or alkaline earth ions (e.g., $Ca^{2+}$ or $Mg^{2+}$) that may be exchanged for other alkali metal or alkaline earth ions. If the glass ceramic material comprises sodium ions, the sodium ions may be exchanged for potassium ions. Similarly, if the glass ceramic material comprises lithium ions, the lithium ions may be exchanged for sodium ions and/or potassium ions. The ion exchange may occur in the glass phase, in a crystalline phase, or both. Exchange of smaller ions in the glass ceramic material for larger ions can form a compressive stress layer along a surface of the glass ceramic material. Formation of such a compressive stress layer can increase the hardness and impact resistance of the glass ceramic material.

Figure 3A:
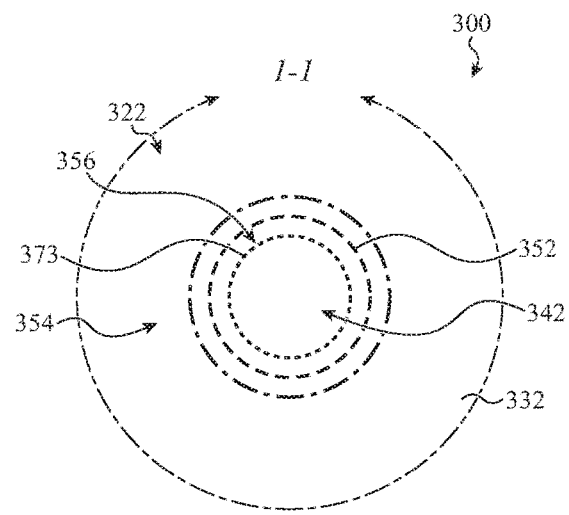
FIG. 3A shows a detail view of an example electronic device.

FIG. 3A shows another example of an enlarged top view of an electronic device and may show another example of detail area 1-1 of FIG. 1A. In the example of FIG. 3A, the electronic device 300 includes an optical component 373 positioned under the cover 322 and indicated with dashed lines. The cover 322 includes a cover member 332 and the portion 342 of the cover member 332 defines a window for the optical component 373. The portion 342 of the cover member may therefore be referred to as a window portion. The optical component 373 may be an optical component of a camera assembly, a sensor assembly, or the like.

The enlarged view of FIG. 3A shows three chemically strengthened zones 352, 354, and 356 of the cover member 332. In the example of FIG. 3A, the chemically strengthened zone 356 includes the window portion 342 and the chemically strengthened zone 352 surrounds the window portion 342. The boundaries of the chemically strengthened zone 352 are shown with dashed lines. The chemically strengthened zone 352 is surrounded by the chemically strengthened zone 354 and the chemically strengthened zone 352 surrounds the chemically strengthened zone 356. Furthermore, the chemically strengthened zone 352 is adjacent each of the chemically strengthened zones 354 and 356.

In the example of FIG. 3A, the chemically strengthened zone 352 is chemically strengthened to a different extent than the chemically strengthened zones 354 and 356. For example, the chemically strengthened zone 352 may be chemically strengthened to a greater extent than the chemically strengthened zones 354 and 356 and may be configured to divert a crack away from the window portion 342.

For example, a chemically strengthened zone 352 which is chemically strengthened to a greater extent may have a greater depth of compression, a greater maximum compressive stress, and/or a greater maximum surface compressive stress than the chemically strengthened zones 354 and 356. In some cases, each of the chemically strengthened zones 354 and 356 include an internal region that is in tension and defines a stress profile that includes both compressive and tensile stress regions, as schematically illustrated in the cross-section view of FIG. 7. In some cases, the chemically strengthened zone 352 is in compression through a thickness of the cover member and defines a compressive stress profile extending through the thickness. In other cases, the chemically strengthened zone 352 defines a stress profile that includes both compressive and tensile stress regions. However, the compressive stress region extending from the exterior surface of the cover member in the chemically strengthened zone 352 may be deeper than the compressive stress region extending from the exterior surface of the cover member in the chemically strengthened zones 354 and/or 356. Alternately or additionally, the compressive stress region extending from the interior surface of the cover member in the chemically strengthened zone 352 may be deeper than the compressive stress region extending from the interior surface of the cover member in the chemically strengthened zones 354 and/or 356. For example, one or more of the compressive stress regions in the chemically strengthened zone 352 may have a depth that is at least 50%, 75%, 100%, 150%, or 200% greater than a depth of the corresponding compressive stress region in the chemically strengthened zones 354 and/or 356. In some examples, the stress profile of the chemically strengthened zone 352 may be referred to as a first compressive stress profile or as a barrier stress profile and the stress profile of the chemically strengthened zone 356 may be referred to as a second compressive stress profile or as a window stress profile.

In these cases, the maximum compressive surface stress of the chemically strengthened zone 352 may be greater than the maximum compressive surface stress of the chemically strengthened zones 354 and 356. For example, the maximum compressive surface stress of the chemically strengthened zone 352 may be at least 5% or at least 10% greater than the maximum compressive surface stress of the chemically strengthened zones 354 and 356. The chemically strengthened zones 354 and 356 may be strengthened similarly or differently. Each of the chemically strengthened zones 352, 354, and 356 may be chemically strengthened through ion exchange, as previously described and also described with respect to at least FIGS. 9 through 12D.

Figure 3B:
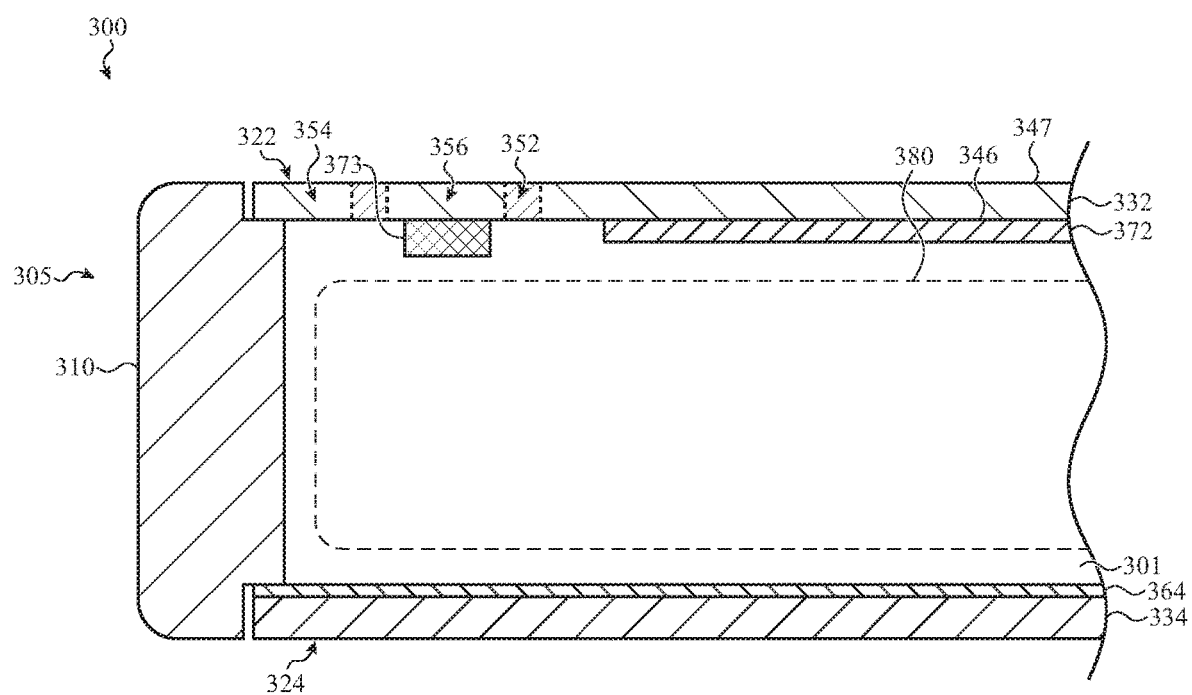
FIG. 3B shows a partial cross-section view of the device of FIG. 3A.

FIG. 3B shows a partial cross-section view of the device of FIG. 3A. The device 300 includes an enclosure 305 and the enclosure 305 includes a front cover 322, a rear cover 324, and an enclosure component 310. The front cover 322 includes a cover member 332 and the rear cover 324 includes a cover member 334. The enclosure 305 defines an interior cavity 301 and the electronic device 300 further includes a display 372, and an optical component 373. The device 300 may also include additional components 380 positioned within the interior cavity, as indicated by the dashed line. The cover member 332 defines an exterior surface 347 and an interior surface 346. As shown in FIG. 3B, the cover 324 includes a coating 364 along its interior surface, which may be similar in function and properties to the coating 264.

In the example of FIG. 3B, the cover member 332 includes a chemically strengthened zone 352 and chemically strengthened zones 354 and 356. As previously described with respect to FIG. 3A, the chemically strengthened zone 352 is chemically strengthened to a different extent than the chemically strengthened zones 354 and 356. Additional description of differently chemically strengthened zones is provided with respect to FIGS. 7 through 8B and is not repeated here.

The cover member 332 is positioned over both the display 372 and the optical component 373. The cover member 332 includes a chemically strengthened zone 356, which is positioned over the optical component 373 and extends through a thickness of the cover member 332. The cover member 332 also includes a chemically strengthened zone 352 which surrounds the chemically strengthened zone 356 and extends through the thickness of the cover member. The boundaries of the chemically strengthened zone 352 are shown with dashed lines. The depiction of the boundaries of the chemically strengthened zone 352 is exemplary rather than limiting and in additional examples the boundaries may be curved rather than straight. The chemically strengthened zone 352 is surrounded by the chemically strengthened zone 354. As previously shown and described with respect to FIG. 3A, the chemically strengthened zone 356 includes the window portion 342, which has not been shown in FIG. 3B for clarity of illustration.

Figure 4:
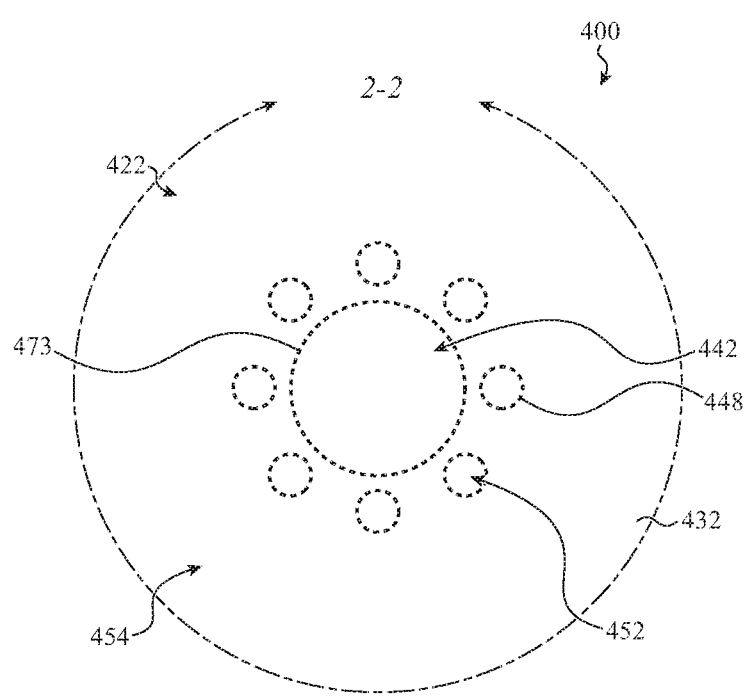
FIG. 4 shows a detail view of an example electronic device.

FIG. 4 shows another example of an enlarged top view of an electronic device and may show another example of detail area 1-1 of FIG. 1A. In the example of FIG. 4, the electronic device 400 includes an optical component 473 positioned under the cover 422 and indicated with dashed lines. The cover 422 includes a cover member 432 and the portion 442 of the cover member 432 defines a window for the optical component 473 The portion 442 of the cover member may therefore be referred to as a window portion. The optical component 473 may be an optical component of a camera assembly, a sensor assembly, or the like.

The enlarged view of FIG. 4 shows a set of barrier portions 448 of the cover member 432. The boundary of each of the barrier portions 448 is shown with dashed lines. In FIG. 4, the set of barrier portions 448 is arranged at least partially around a window portion 442 of the cover member. The set of barrier portions 448 may also be described as at least partially surrounding the window portion 442. In the example of FIG. 4, each barrier portion 448 of the set of barrier portions is spaced apart from an adjacent barrier portion 448.

Each of the barrier portions 448 includes a chemically strengthened zone 452, which may also be referred to herein as a localized chemically strengthened zone or simply as a zone. The set of chemically strengthened zones 452 is surrounded by the chemically strengthened zones 454. The set of chemically strengthened zones 452 may also be described as defining "islands" having a greater extent of chemical strengthening than the adjacent zone 454. In embodiments, adjacent chemically strengthened zones 452 are spaced apart from each other.

In the example of FIG. 4, each of the chemically strengthened zones 452 is chemically strengthened to a different extent than the chemically strengthened zones 454. For example, each of the chemically strengthened zones 452 may be chemically strengthened to a greater extent than the chemically strengthened zone 454 and may be positioned to help divert cracks away from the window portion 442.

For example, each of the chemically strengthened zones 452 may have a greater depth of compression, a greater maximum compressive stress, and/or a greater surface compressive stress than the chemically strengthened zone 454. The chemically strengthened zone 454 may include an internal region that is in tension and defines a stress profile that includes both compressive and tensile stress regions, as schematically illustrated in the cross-section view of FIG. 7. In some cases, one or more of the chemically strengthened zones 452 are in compression though a thickness of the cover member and define a compressive stress profile extending through the thickness. In other cases, one or more of the chemically strengthened zones 452 define a stress profile that includes both compressive and tensile stress regions. However, the compressive stress region extending from the exterior surface of the cover member in the chemically strengthened zones 452 may be deeper than the compressive stress region extending from the exterior surface of the cover member in the chemically strengthened zone 454. Alternately or additionally, the compressive stress region extending from the interior surface of the cover member in the chemically strengthened zones 452 may be deeper than the compressive stress region extending from the interior surface of the cover member in the chemically strengthened zone 454. For example, one or more of the compressive stress regions in the chemically strengthened zones 452 may have a depth that is at least 50%, 75%, 100%, 150%, or 200% greater than a depth of the corresponding compressive stress region in the chemically strengthened zone 454. In some examples, the stress profile of each of the chemically strengthened zones 452 may be referred to as a first compressive stress profile or as a barrier stress profile and the stress profile of the chemically strengthened zone 442 may be referred to as a second compressive stress profile or as a window stress profile.

In these cases, the maximum compressive surface stress of the chemically strengthened zones 452 may be greater than the maximum compressive surface stress of the chemically strengthened zone 454. For example, the maximum compressive surface stress of the chemically strengthened zones 452 may be at least 5% or at least 10% greater than the maximum compressive surface stress of the chemically strengthened zone 454. Each of the chemically strengthened zones 452 and 454 may be chemically strengthened through ion exchange, as previously described and also described with respect to at least FIGS. 9 through 12D.

Figure 5A:
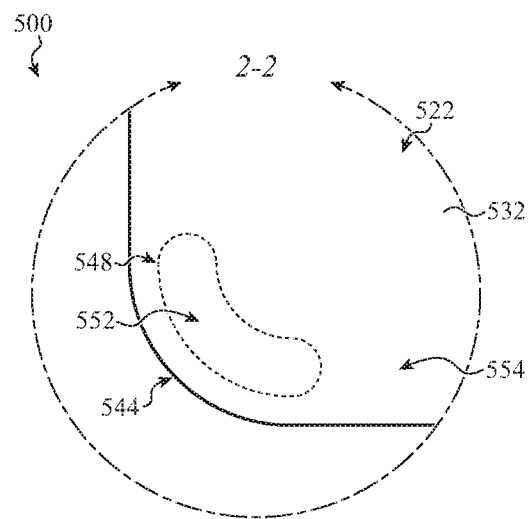
FIG. 5A shows a detail view of an example electronic device.

FIG. 5A shows another example of an enlarged top view of an electronic device 500 and may show an example of detail area 2-2 of FIG. 1B. The cover 522 includes a cover member 532 that defines a corner portion 544. The enlarged view of FIG. 5A shows a barrier portion 548 of the cover member 532. The boundary of the barrier portion 548 is shown with dashed lines. In FIG. 5A, the barrier portion 548 is positioned proximate a corner portion 544 of the cover member. In some cases, the cover member may define multiple corner portions and barrier portions may be positioned proximate each of the multiple corner portions. These barrier portions may be configured to protect a window portion of the cover member positioned over a display. In some embodiments the cover member 532 defines four corner portions 544.

The barrier portion 548 includes a chemically strengthened zone 552, which may also be referred to herein as a localized chemically strengthened zone or simply as a zone. The chemically strengthened zone 552 is at least partially surrounded by a chemically strengthened zone 554.

In the example of FIG. 5A, the chemically strengthened zone 552 is chemically strengthened to a different extent than the chemically strengthened zone 554. In some cases, the chemically strengthened zone 552 has a greater extent of chemical strengthening than the chemically strengthened zone 554 and is positioned to help divert cracks away from another zone of the cover member to be protected. For example, when the chemically strengthened zone 552 is positioned proximate the corner portion 554, the chemically strengthened zone 552 can help block a crack originating from damage to the corner portion of the cover glass from propagating toward a more central portion of the cover member.

For example, a chemically strengthened zone 552 may have a greater depth of compression, a greater maximum compressive stress, and/or a greater surface compressive stress than the chemically strengthened zone 554. The chemically strengthened zone 554 may include an internal region that is in tension and defines a stress profile that includes both compressive and tensile stress regions, as schematically illustrated in the cross-section view of FIG. 7. In some cases, one or more of the chemically strengthened zones 552 are in compression though a thickness of the cover member and define a compressive stress profile extending through the thickness. In other cases, one or more of the chemically strengthened zones 552 define a stress profile that includes an internal region that includes both compressive and tensile stress regions. However, the compressive stress region extending from the exterior surface of the cover member in the chemically strengthened zone 552 may be deeper than the compressive stress region extending from the exterior surface of the cover member in the chemically strengthened zone 554. Alternately or additionally, the compressive stress region extending from the interior surface of the cover member in the chemically strengthened zone 552 may be deeper than the compressive stress region extending from the interior surface of the cover member in the chemically strengthened zone 554. For example, one or more of the compressive stress regions in the chemically strengthened zone 552 may have a depth that is at least 50%, 75%, 100%, 150%, or 200% greater than a depth of the corresponding compressive stress region in the chemically strengthened zone 554. In some examples, the stress profile of the chemically strengthened zone 552 may be referred to as a barrier stress profile.

In these cases, the maximum compressive surface stress of the chemically strengthened zone 552 may be greater than the maximum compressive surface stress of the chemically strengthened zone 554. For example, the maximum compressive surface stress of the chemically strengthened zone 552 may be at least 5% or at least 10% greater than the maximum compressive surface stress of the chemically strengthened zone 554. Each of the chemically strengthened zones 552 and 554 may be chemically strengthened through ion exchange, as previously described and also described with respect to at least FIGS. 9 through 12D.

Figure 5B:
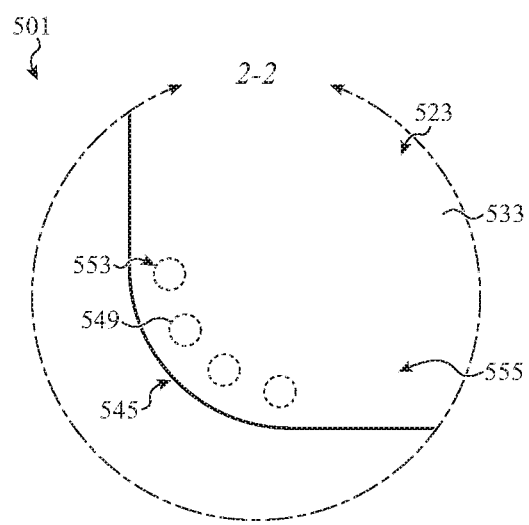
FIG. 5B shows a detail view of an example electronic device.

FIG. 5B shows another example of an enlarged top view of an electronic device 501 and may show another example of detail area 2-2 of FIG. 1B. The cover 523 includes a cover member 533 that defines a corner portion 545. In some embodiments the cover member 533 defines four corner portions 545.

The enlarged view of FIG. 5B shows a set of barrier portions 549 of the cover member 532. The boundary of each of the barrier portions 549 is shown with dashed lines. In FIG. 5B, the set of barrier portions 549 is arranged proximate a corner portion 545 of the cover member 533. As shown in FIG. 5B, the corner portion 545 defines a curved profile and the barrier portions 549 are offset inward from the curved profile. In some cases, only a subset of the barrier portions is offset from the curved profiles at the edge of the cover member. FIG. 5B shows four barrier portions 549 arranged proximate the corner portion, but this example is not limiting and in additional examples two, three, five, six or more barrier portions 549 may be arranged proximate the corner portion 545. In some cases, the cover member may define multiple corner portions and barrier portions may be positioned proximate each of the multiple corner portions.

Each of the barrier portions 549 includes a chemically strengthened zone 553, which may also be referred to herein as a localized chemically strengthened zone or simply as a zone. The set of chemically strengthened zones 553 is surrounded by the chemically strengthened zone 555.

In the example of FIG. 5B, each of the chemically strengthened zones 553 is chemically strengthened to a different extent than the chemically strengthened zone 555. In some cases, one or more of the chemically strengthened zones 553 has greater extent of chemical strengthening than the chemically strengthened zone 555 and is positioned to help divert cracks away from another zone of the cover member to be protected. For example, when the set of chemically strengthened zones 553 is positioned proximate corner portion 545 of the cover glass, the set of chemically strengthened zones 553 can help divert a crack originating from damage to the corner portion of the cover glass. In some cases, the set of chemically strengthened zones 553 is configured to protect a window portion of the cover member positioned over a display.

For example, each of the chemically strengthened zones 553 may have a greater depth of compression and/or a greater surface compressive stress than the chemically strengthened zone 555. The chemically strengthened zone 555 may include an internal region that is in tension and defines a stress profile that includes both compressive and tensile stress regions, as schematically illustrated in the cross-section view of FIG. 7. In some cases, one or more of the chemically strengthened zones 553 are in compression through a thickness of the cover member and defines a compressive stress profile extending through the thickness. In other cases, one or more of the chemically strengthened zones 553 define a stress profile that includes both compressive and tensile stress regions. However, the compressive stress region extending from the exterior surface of the cover member in the chemically strengthened zones 553 may be deeper than the compressive stress region extending from the exterior surface of the cover member in the chemically strengthened zone 555. Alternately or additionally, the compressive stress region extending from the interior surface of the cover member in the chemically strengthened zones 553 may be deeper than the compressive stress region extending from the interior surface of the cover member in the chemically strengthened zone 555. For example, one or more of the compressive stress regions in the chemically strengthened zones 553 may have a depth that is at least 50%, 75%, 100%, 150%, or 200% greater than a depth of the corresponding compressive stress region in the chemically strengthened zone 555. In some examples, the stress profile of each of the chemically strengthened zones 553 may be referred to as a barrier stress profile.

In these cases, the maximum compressive surface stress of one or more of the chemically strengthened zones 553 may be greater than the maximum compressive surface stress of the chemically strengthened zone 555. For example, the maximum compressive surface stress of the chemically strengthened zones 553 may be at least 5% or at least 10% greater than the maximum compressive surface stress of the chemically strengthened zone 555. Each of the chemically strengthened zones 553 and 555 may be chemically strengthened through ion exchange, as previously described and also described with respect to at least FIGS. 9 through 12D.

FIG. 6A shows a cover member of an electronic device. In FIG. 6A, the cover member 632a is positioned to show an interior surface 646 of the cover member. The cover member defines a central portion 642a, a peripheral portion 644, and a transition portion 643 between the central and the peripheral portions. In some cases, the transition portion 643 defines a bend in the cover member.

FIG. 6A shows a barrier portion 648 of the cover member 632a. The boundary of the barrier portion 648 is shown with dashed lines. In FIG. 6A, the barrier portion 648 is positioned proximate the transition portion 643 of the cover member and a corner 635a. In the example of FIG. 6A, the transition portion 643 defines a bend in the cover member. In some cases, the cover member may include multiple barrier portions positioned proximate transition portions at multiple corners and/or sidewalls of the cover member. The cover member 632a has barrier portions 648 positioned proximate each of the corners 635a. These barrier portions may be configured to protect a window portion of the cover member positioned over a display.

Each of the barrier portions 648 includes a chemically strengthened zone 652, also referred to herein as a localized chemically strengthened zone or simply as a zone. The chemically strengthened zone 652 is at least partially surrounded by a chemically strengthened zone 654.

In the example of FIG. 6A, the chemically strengthened zone 652 is chemically strengthened to a different extent than the chemically strengthened zone 654. In some cases, the chemically strengthened zone 652 has a greater extent of chemical strengthening than the chemically strengthened zone 654 and may be positioned to protect a portion of the cover member from cracking. For example, when the chemically strengthened zone 652 is positioned in or near a transition portion 643 of the cover member, the chemically strengthened zone 652 can help prevent cracking of the transition portion 643 of the cover member. Since the transition region may be most likely to receive a direct impact, positioning the chemically strengthened zone 652 proximate the transition portion can increase the strength of the cover member by arresting a crack at the point of impact. Positioning the chemically strengthened zone 652 proximate the transition portion can also help to prevent a crack in the peripheral portion from traveling to the central portion. In some cases, the chemically strengthened zone 652 is configured to protect a window portion of the cover member positioned over a display.

For example, the chemically strengthened zone 652 may have a greater depth of compression and/or a greater surface compressive stress than the chemically strengthened zone 654. In some cases, the chemically strengthened zone 652 is in compression through a thickness of the cover member and defines a compressive stress profile extending through the thickness. In these cases, the chemically strengthened zone 654 may include an internal region that is in tension and defines a stress profile that includes both compressive and tensile stress regions, as schematically illustrated in the cross-section view of FIG. 7. In these cases, the maximum compressive surface stress of the chemically strengthened zone 652 may be greater than the maximum compressive surface stress of the chemically strengthened zone 654. For example, the maximum compressive surface stress of the chemically strengthened zone 652 may be at least 5% or at least 10% greater than the maximum compressive surface stress of the chemically strengthened zone 654. More generally, the chemically strengthened zones 652 may be similar to the chemically strengthened zone 552 and the chemically strengthened zone 654 may be similar to the chemically strengthened zone 554 described with respect to FIG. 5A. Each of the chemically strengthened zones 652 and 654 may be chemically strengthened through ion exchange, as previously described and also described with respect to at least FIGS. 9 through 12D.

Figure 6B:
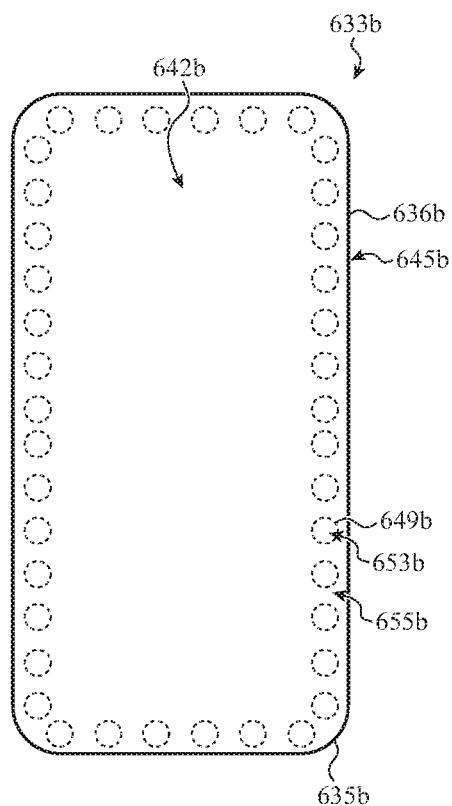

FIG. 6B shows another example of a cover member 633b of an electronic device. The cover member 633b defines a central portion 642b and a peripheral portion 645b. The peripheral portion 645b defines corners 635b and sides 636b.

In the example of FIG. 6B, the barrier portions 649b are positioned in the peripheral portion 645b and proximate the corners 635b and the sides 636b. In the example of FIG. 6B, each barrier portion 649b of the set of barrier portions is spaced apart from an adjacent barrier portion 649b. In some examples, the barrier portions 649b are spaced substantially uniformly along the sides 636b of the cover member. For example, the center to center spacing of the barrier portions 649b may be substantially uniform. However, this example is not limiting and the spacing of the barrier portions 649b may be adjusted as desired. In some cases, the center to center spacing of the barrier portions 649b proximate the corners 635b may be substantially the same as the center to center spacing proximate the sides 636b while in additional cases the center to center spacing of the barrier portions 649b proximate the corners 635b may be different (e.g., reduced). In the example of FIG. 6B, the barrier portions 649b are substantially uniform in diameter, but in additional examples the size of the barrier portions 649b may be adjusted as desired.

Each of the barrier portions 649b includes a chemically strengthened zone 653b, which may also be referred to herein as a localized chemically strengthened zone or simply as a zone. The set of chemically strengthened zones 653b is surrounded by the chemically strengthened zone 655b. The chemically strengthened zones 653b may be similar to the chemically strengthened zones 553 and the chemically strengthened zone 655b may be similar to the chemically strengthened zone 555 described with respect to FIG. 5B and for brevity that description is not repeated here.

Figure 6C:
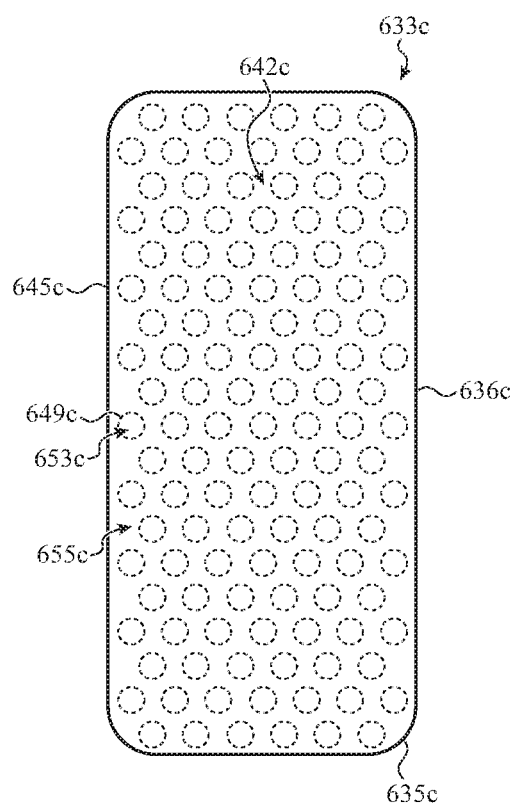

FIG. 6C shows another example of a cover member 633c of an electronic device. The cover member 633c defines a central portion 642c and a peripheral portion 645c. The peripheral portion 645c defines corners 635c and sides 636c.

In the example of FIG. 6C, the barrier portions 649c are arranged to define a pattern across the central portion 642c. Some of the barrier portions 649c are also placed proximate the corners 635c and the sides 636c. In the example of FIG. 6C, each barrier portion 649c of the set of barrier portions is spaced apart from an adjacent barrier portion 649c. In some examples, the barrier portions 649c are spaced substantially uniformly and define a substantially uniform center to center spacing. However, this example is not limiting and the spacing of the barrier portions 649c may be adjusted as desired. In the example of FIG. 6C, the barrier portions 649c are substantially uniform in diameter, but in additional examples the size of the barrier portions 649c may be adjusted as desired.

Each of the barrier portions 649c includes a chemically strengthened zone 653c, which may also be referred to herein as a localized chemically strengthened zone or simply as a zone. The set of chemically strengthened zones 653c is surrounded by the chemically strengthened zone 655c. The chemically strengthened zones 653c may be similar to the chemically strengthened zones 553 and the chemically strengthened zone 655c may be similar to the chemically strengthened zone 555 described with respect to FIG. 5B and for brevity that description is not repeated here.

Figure 7:
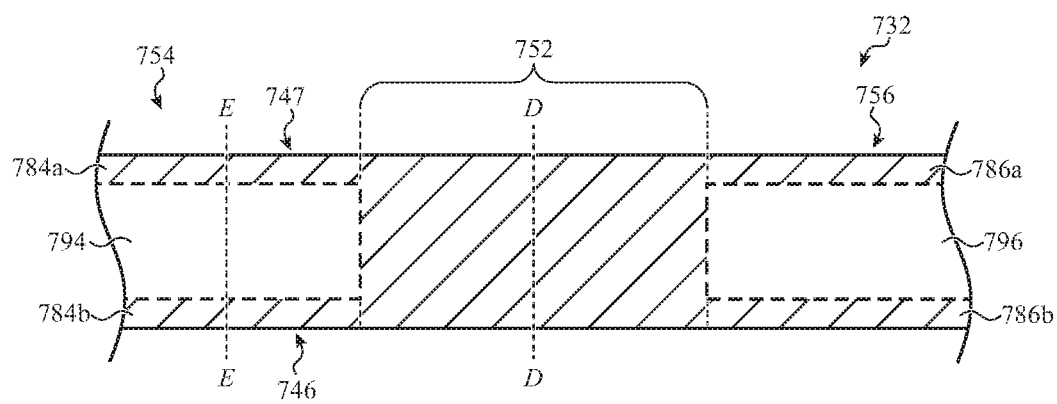
FIG. 7 shows a partial cross-section view of a cover member.

FIG. 7 shows a partial cross-section view of a cover member 732. For example, FIG. 7 could be an example of a cross-section through the chemically strengthened zone 352 of FIGS. 3A and 3B. The cover member 732 includes the chemically strengthened zones 752, 754, and 756.

In the example of FIG. 7, the chemically strengthened zone 752 is chemically strengthened to a greater extent than the chemically strengthened zones 754 and 756. As previously described, the chemically strengthened zone 752 can have greater crack resistance than the chemically strengthened zones 754 and 756 and can be used to protect one or more portions of the cover. Hatching is used to indicate regions of compression (also referred to as compressive stress regions) in FIG. 7.

In the example of FIG. 7, the chemically strengthened zone 752 is under compression through the thickness of the cover member 732 and defines a compressive stress region. The chemically strengthened zone 754 includes a compressive stress region 784a along the exterior surface 747, a compressive stress region 784b along the interior surface 746, and a tensile stress region 794 between the compressive stress regions 784a and 784b. The chemically strengthened zone 756 includes a compressive stress region 786a along the exterior surface 747, a compressive stress region 786b along the interior surface 746, and a tensile stress region 796 between the compressive stress regions 786a and 786b. As shown in FIG. 7, the compressive stress region 784a is similar in depth to the compressive stress region 784b and the compressive stress region 786a is similar in depth to the compressive stress region 786b.

Figure 8A:
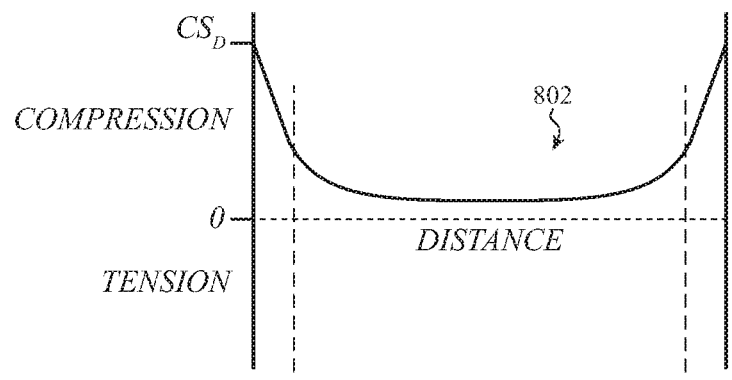
FIG. 8A shows a stress profile extending through a thickness of a cover member.

FIG. 8A shows a stress profile extending through a thickness of a cover member. For example, FIG. 8A may show an example of a stress profile along line D-D in the chemically strengthened zone 752 of FIG. 7. The solid vertical lines in FIG. 8A indicate the surfaces of the cover member and the distance between the solid vertical lines corresponds to the thickness of the cover member.

The stress profile 802 indicates that the cover member is in compression along the thickness and therefore the stress profile 802 may be referred to as a compressive stress profile. As shown in FIG. 8A, the stress profile 802 has a surface compressive stress $CS_D$ at the surfaces of the cover member and a lesser compressive stress at a midpoint of the thickness of the cover member. In the example of FIG. 8A, the stress profile 802 is substantially symmetric about a midpoint of the thickness of the cover member.

Figure 8B:
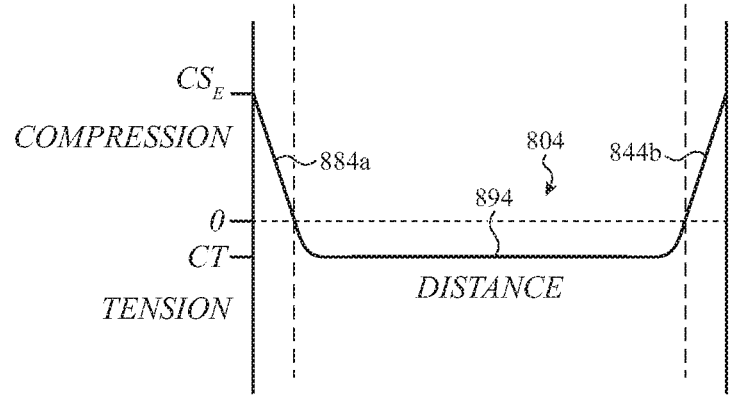
FIG. 8B shows another stress profile extending through a thickness of a cover member.

FIG. 8B shows another stress profile extending through a thickness of a cover member. For example, FIG. 8B may show an example of a stress profile along line E-E in the chemically strengthened zone 754 of FIG. 7. The solid vertical lines in FIG. 8B indicate the surfaces of the cover member and the distance between the solid vertical lines corresponds to the thickness of the cover member.

As shown in FIG. 8B, the stress profile 804 includes compressive stress regions 884a and 884b and a tensile stress region 894. The compressive stress region 884a may correspond to the compressive stress region 784a, the compressive stress region 884b may correspond to the compressive stress region 784b, and the tensile stress region 894 may correspond to the tensile stress region 794. The stress profile 804 has a surface compressive stress $CS_E$, less than $CS_D$, at the surfaces of the cover member and a central tension CT. In the example of FIG. 8B, the stress profile 804 is substantially symmetric about a midpoint of the thickness of the cover member.

In additional cases, a chemically strengthened zone having a greater extent of chemical strengthening may be configured to have a deeper compressive stress region, but a lower central tension, than an adjacent chemically strengthened zone. Such a chemically strengthened zone may also have greater crack resistance than the adjacent chemically strengthened zone.

The differentially strengthened cover members described herein may be chemically strengthened using one or more ion exchange operations. In some embodiments, the ion exchange operation exchanges smaller ions in the cover member for larger ions from a molten salt bath or other external source of ions to introduce compressive stress into the cover member. In additional embodiments, the ion exchange operation exchanges larger ions in the cover member for smaller ions from a molten salt bath or other external source of ions to introduce tensile stress into the cover member. The composition of the cover member prior to any ion exchange operation is referred to herein as the native composition of the cover member, such as a native glass composition or a native glass ceramic composition. An ion exchange operation may be conducted using a bath or other ion source which comprises one or more ions to be exchanged with ions in the cover member. Other types of ion sources include pastes, which may include higher concentrations of sources of the ions to be introduced into the cover member than an ion exchange bath. As an example, the ion source may comprise one or more of lithium, sodium, and potassium ions. The ion-exchange operation typically occurs at temperatures above ambient temperature.

In some embodiments, a process for differentially strengthening a cover member comprises applying a mask to the cover member prior to performing an ion exchange operation. Typically, the mask exposes one or more areas of the cover member while covering others. The mask is configured to reduce the rate of ion exchange through the mask as compared to the rate of ion exchange at the exposed areas of the cover member. The mask may be formed of a patterned coating of a metal, an oxide material (e.g., silicon oxide), or a nitride material (e.g., silicon nitride).

Figure 9:
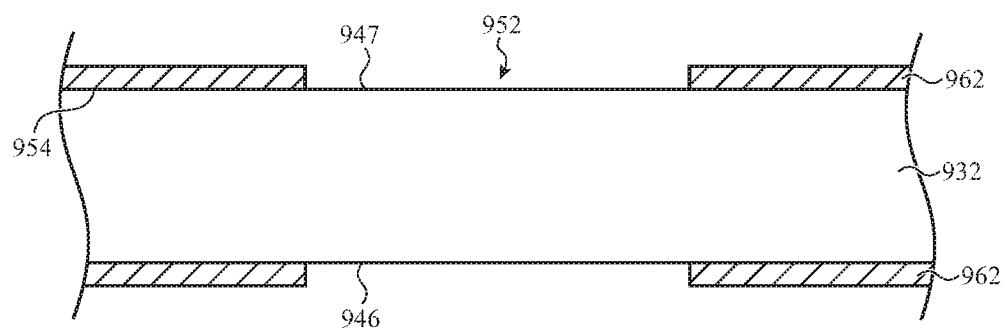
FIG. 9 shows a partial cross-section view of a mask applied to a cover member.

In some embodiments, the mask exposes the areas of the glass that are to be chemically strengthened to a greater extent. FIG. 9 shows a partial cross-section view of a mask 962 applied to a cover member 932. In the example of FIG. 9, the mask 962 exposes a portion of the exterior and interior surfaces (947, 946) of the cover member. In the example of FIG. 9, the mask 962 is applied to both the exterior surface 947 and the interior surface 946.

Figure 10A:
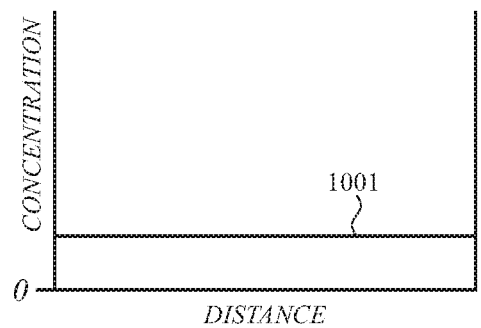
FIGS. 10A, 10B, 10C, and 10D show examples of concentration profiles at different stages in a process for chemically strengthening a cover member.
Figure 10B:
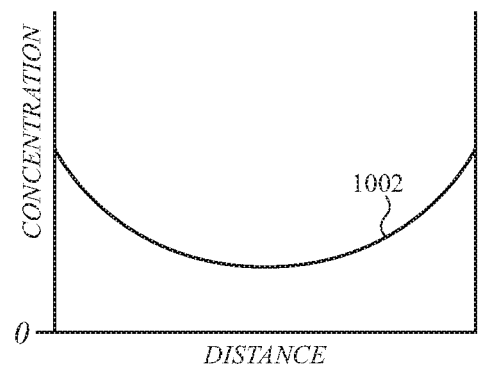

In the example of FIG. 9, a greater extent of ion exchange will occur in the chemically strengthened zone 952 than in the adjacent zone 954 that is covered by the mask. In embodiments, smaller ions in the cover member are exchanged for larger ions to produce chemical strengthening of the cover. In some cases, the first ion exchange operation is conducted so that the larger ions introduced from both the exterior surface 947 and the interior surface 946 diffuse to a midpoint (of the thickness) of the cover member in the chemically strengthened zone 952. As a result, a concentration of the larger ions may be greater at a midpoint of the cover member in the chemically strengthened zone 952 than the concentration present in the native glass. For example, if the first ion exchange exchanges lithium ions in the glass for sodium ions, the concentration of sodium (ions) at the midpoint of the cover in the chemically strengthened zone 952 may be greater than the sodium concentration present in the native composition, as schematically illustrated in FIGS. 10A and 10B. Some of the larger ions may diffuse into an adjacent masked zone of the cover member (e.g., the zone 954) during the first ion exchange, but the concentration of the larger ions is typically less than in the chemically strengthened zone 952.

After the first ion exchange operation is conducted, the mask may be removed. For example, the mask may be removed using a polishing operation.

Figure 10C:
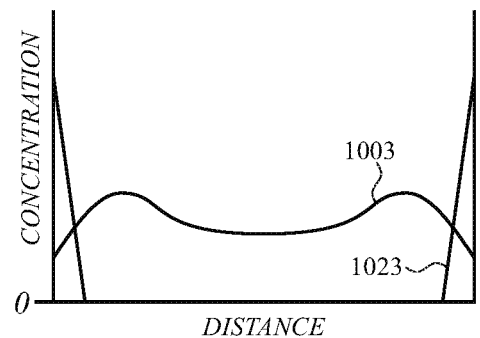

A second ion exchange operation may be conducted after the mask is removed. For example, the second ion exchange may exchange sodium ions in the glass for potassium ions. The second ion exchange may form potassium enriched layers along the exterior and interior surfaces of the cover member in both the zone 952 and in the adjacent zone 954. The second ion exchange may also modify the distribution of sodium ions within the cover member. FIG. 10C schematically illustrates concentrations of sodium and potassium ions in the zone 952 after the second ion exchange operation.

FIGS. 10A, 10B, 10C, and 10D show examples of concentration profiles at different stages in a process for chemically strengthening a cover member. The concentration profiles shown in FIGS. 10A, 10B, and 10C may represent the concentration profiles for the chemically strengthened zone 952 shown in FIG. 9. The concentration profiles shown in FIG. 10D may represent the concentration profiles for the chemically strengthened zone 954 shown in FIG. 9. The solid vertical lines in FIGS. 10A, 10B, 10C, and 10D indicate the surfaces of the cover member and the distance between the solid vertical lines corresponds to the thickness of the cover member. Furthermore, any of the ion exchange operations described with respect to FIGS. 10A, 10B, 10C, and 10D may be conducted using a bath or other ion source which comprises a mixture of ions, such as a mixture of two or more of lithium, sodium, and potassium ions.

FIG. 10A shows an example of a sodium concentration profile 1001 prior to a first ion exchange operation. The sodium concentration, which is the native sodium concentration within the cover member, is substantially uniform across the thickness of the cover member. In this example, the native composition of the cover member also includes lithium and typically also includes other elements.

FIG. 10B shows an example of a sodium concentration profile 1002 following a first ion exchange in which lithium ions in the cover member are exchanged for sodium ions from a bath or another source of sodium ions. As shown in FIG. 10B, the sodium concentration at the surfaces of the cover member is greater than the sodium concentration at the midpoint of the thickness in the sodium concentration profile 1002. In the example of FIG. 10B, the sodium concentration at the midpoint of the thickness is greater than the native sodium concentration indicated by the sodium concentration profile 1001 of FIG. 10A. The overall amount of lithium in this zone of the cover member will decrease due to the exchange of sodium ions for lithium ions in the first ion exchange operation.

FIG. 10C shows an example of a sodium concentration profile 1003 following a second ion exchange in which sodium ions in the glass are exchanged for potassium ions from a bath or another source of potassium ions. As compared to the sodium concentration profile 1002 of FIG. 10B, the concentration of sodium (ions) at the surface has decreased at the surface of the cover member in the sodium concentration profile 1003. In addition, the concentration of sodium (ions) has increased deeper in the cover due to additional inward diffusion of sodium ions. FIG. 10C also shows an example of a potassium concentration profile 1023 following the second ion exchange. The overall amount of lithium in this zone of the cover member (not shown), may further decrease due to the exchange of potassium ions for sodium ions in the first ion exchange operation.

Figure 10D:
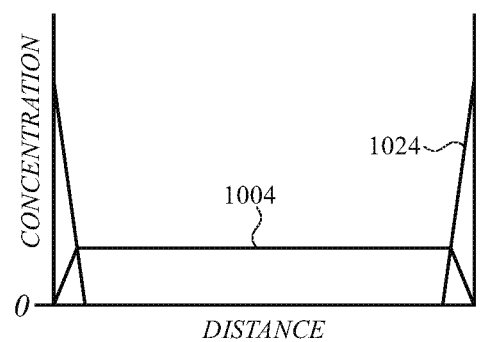

FIG. 10D shows an example of a sodium concentration profile 1004 in another chemically strengthened zone. For example, the chemically strengthened zone shown in FIG. 10D may be present in a portion of the cover member covered by a mask during the first ion exchange and then unmasked during the second ion exchange (e.g., the chemically strengthened zone 954 shown in FIG. 9). As shown in FIG. 10D, the sodium concentration at the midpoint of the sodium concentration profile 1004 is less than the sodium concentration at the midpoint of the sodium concentration profile 1003 of FIG. 10C. In the example of FIG. 10D, the sodium concentration at the surfaces of the cover member is lower for the sodium concentration profile 1004 than for the sodium concentration profile 1003. An exemplary potassium concentration profile 1024 is also shown in FIG. 10D. As shown in the example of FIG. 10D, the potassium concentration profile 1024 is similar to the concentration profile 1023, but this example is not limiting and in additional examples the potassium concentration at the surface is significantly lower in the concentration profile 1024 than in the concentration profile 1023. This adjacent chemically strengthened zone may also have a higher concentration of lithium (ions) in the interior portion of the cover member. As a result, a tensile stress zone may be generated in the chemically strengthened zone shown in FIG. 10D.

Figure 11:
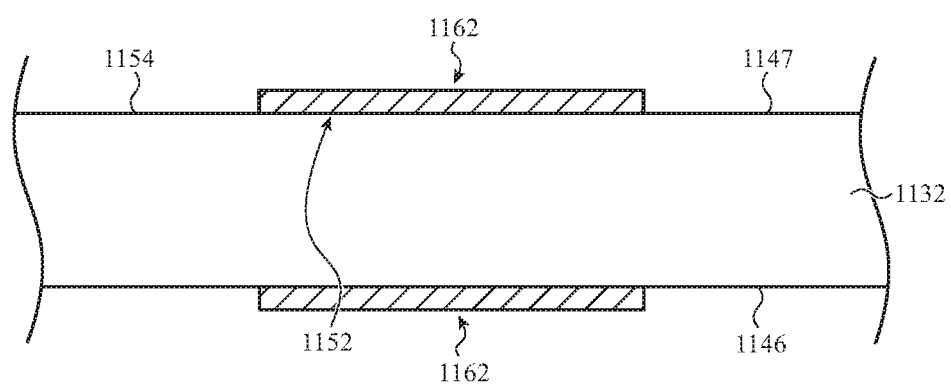
FIG. 11 shows another partial cross-section view of a mask applied to a cover member.

In some embodiments, the mask covers the areas of the glass that are to be chemically strengthened to a greater extent. FIG. 11 shows another partial cross-section view of a mask 1162 applied to a cover member 1132. In the example of FIG. 11, the mask 1162 exposes a portion of the exterior and interior surfaces (1147, 1146) of the cover member. In the example of FIG. 11, the mask 1162 is applied to both the exterior surface 1147 and the interior surface 1146.

During a first ion exchange operation in which larger ions in the cover member are exchanged for smaller ions, a greater extent of ion exchange will occur in the ion-exchanged zone 1154 than in the adjacent zone 1152 that is covered by the mask. In some cases, the first ion exchange in the zone 1154 may be conducted so that the smaller ions introduced from both the exterior surface 1147 and the interior surface 1146 diffuse to a midpoint (of the thickness) of the cover member. Therefore, a concentration of the smaller ions may be greater at a midpoint of the cover member than the concentration present in the native composition of the cover member. For example, if the first ion exchange exchanges sodium ions in the cover member for lithium ions, the concentration of lithium (ions) at the midpoint of the cover may be greater than the concentration of lithium (ions) present in the native composition of the cover member, as schematically illustrated in FIG. 12B. After the first ion exchange operation is conducted, the mask may be removed. For example, the mask may be removed using a polishing operation.

A second ion exchange operation may be conducted after the mask is removed. As one example, the second ion exchange may exchange lithium ions in the glass for sodium ions. As an additional example, the second ion exchange operation may exchange lithium ions in the glass for potassium ions. Both types of ion exchange may occur during the second ion exchange operation. The second ion exchange operation may form chemically strengthened layers along the exterior and interior surfaces of the cover member. In some examples a third ion exchange operation exchanges sodium ions in the glass for potassium ions.

FIGS. 12A, 12B, 12C, and 12D show examples of concentration profiles at different stages in another process for chemically strengthening a cover member. The concentration profiles shown in FIGS. 12A, 12B, and 12C may represent the concentration for the zone 1154 shown in FIG. 11. The concentration profiles shown in FIG. 12D may represent the concentration profiles for the chemically strengthened zone 1152 shown in FIG. 11. The solid vertical lines in FIGS. 12A, 12B, 12C, and 12D indicate the surfaces of the cover member and the distance between the solid vertical lines corresponds to the thickness of the cover member.

Figure 12A:
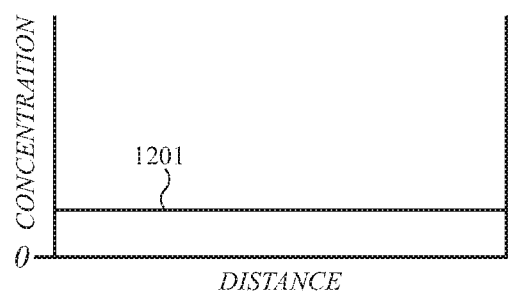
FIGS. 12A, 12B, 12C, and 12D show examples of concentration profiles at different stages in another process for chemically strengthening a cover member.
Figure 12B:
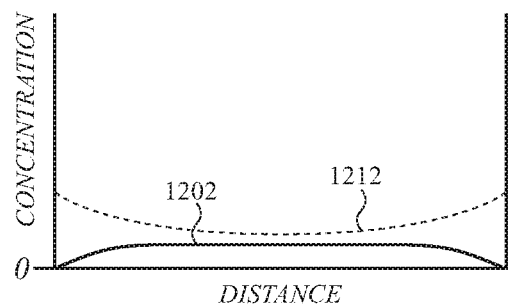

FIG. 12A shows examples of a sodium concentration profile 1201 prior to a first ion exchange operation. The sodium concentration, which is the native sodium concentration within the cover member, is substantially uniform across the thickness of the cover member. In some examples the cover member may also have a native lithium concentration, which may also be substantially uniform across the thickness of the cover member. Any of the ion exchange operations described with respect to FIGS. 12A, 12B, 12C, and 12D may be conducted using a bath or other ion source which comprises a mixture of ions, such as a mixture of two or more of lithium, sodium, and potassium ions.

FIG. 12B shows an example of a sodium concentration profile 1202 and a lithium concentration profile 1212 following a first ion exchange in which sodium ions in the cover member are exchanged for lithium ions from a bath or another source of lithium ions. The lithium concentration profile 1212 is shown with dashed lines for convenience of illustration. As shown in FIG. 12B, the lithium concentration at the surfaces of the cover member is greater than the lithium concentration at the midpoint of the thickness in the lithium concentration profile 1212. The overall amount of sodium in this zone of the cover member will decrease due to the exchange of sodium ions for lithium ions in the first ion exchange operation, as shown by the sodium concentration profile 1202. The sodium concentration profile 1202 shows that the decrease in sodium concentration is greater at the surfaces than at the midpoint of the cover member. The sodium concentration profile 1202 shown in FIG. 12B is exemplary rather than limiting and in additional examples the sodium concentration profile may have a different sodium concentration at the surface and/or the interior and therefore may have a different shape than shown in FIG. 12B.

Figure 12C:
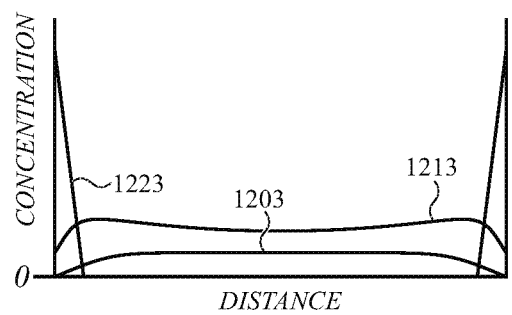

FIG. 12C shows an example of a lithium concentration profile 1213 following a second ion exchange in which sodium ions and lithium ions in the glass are exchanged for potassium ions from a bath or another source of potassium ions. As compared to the lithium concentration profile 1212, the concentration of lithium (ions) at the surface has decreased at the surface of the cover member in the lithium concentration profile 1213. The concentration of sodium (ions) in the cover member may also decrease to some extent, an example of which is shown in the sodium concentration profile 1203. FIG. 12C also shows an example of a potassium concentration profile 1223 following the second ion exchange.

Figure 12D:
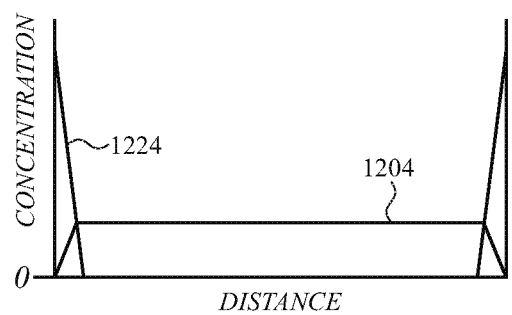

FIG. 12D shows an example of a sodium concentration profile 1204 in another chemically strengthened zone. For example, the chemically strengthened zone shown in FIG. 12D may be present in a portion of the cover member covered by a mask during the first ion exchange and then unmasked during the second ion exchange (e.g., the chemically strengthened zone 1152 shown in FIG. 11). As shown in FIG. 12D, the sodium concentration at the midpoint of the sodium concentration profile 1204 is greater than the sodium concentration at the midpoint of the sodium concentration profile 1203 of FIG. 12C. This adjacent chemically strengthened zone may also have a lower concentration of lithium (ions). As a result, a tensile stress zone may be generated in the chemically strengthened zone shown in FIG. 12C (e.g., the chemically strengthened zone 1154 shown in FIG. 11).

An exemplary potassium concentration profile 1224 is also shown in FIG. 12D. As shown in the example of FIG. 12D, the potassium concentration profile 1224 is similar to the concentration profile 1223, but this example is not limiting and in additional examples the potassium concentration at the surface may be different in the concentration profile 1224 than in the concentration profile 1223.

FIG. 13 shows a block diagram of a sample electronic device that can include a differentially strengthened cover member. The schematic representation depicted in FIG. 13 may correspond to components of the devices and cover members depicted in FIGS. 1A to 12D as described above. However, FIG. 13 may also more generally represent other types of electronic devices including a differentially strengthened component comprising as described herein.

In embodiments, an electronic device 1300 may include sensors 1320 to provide information regarding configuration and/or orientation of the electronic device in order to control the output of the display. For example, a portion of the display 1308 may be turned off, disabled, or put in a low energy state when all or part of the viewable area of the display 1308 is blocked or substantially obscured. As another example, the display 1308 may be adapted to rotate the display of graphical output based on changes in orientation of the device 1300 (e.g., 90 degrees or 180 degrees) in response to the device 1300 being rotated.

The electronic device 1300 also includes a processor 1306 operably connected with a computer-readable memory 1302. The processor 1306 may be operatively connected to the memory 1302 component via an electronic bus or bridge. The processor 1306 may be implemented as one or more computer processors or microcontrollers configured to perform operations in response to computer-readable instructions. The processor 1306 may include a central processing unit (CPU) of the device 1300. Additionally, and/or alternatively, the processor 1306 may include other electronic circuitry within the device 1300 including application specific integrated chips (ASIC) and other microcontroller devices. The processor 1306 may be configured to perform functionality described in the examples above.

The memory 1302 may include a variety of types of non-transitory computer-readable storage media, including, for example, read access memory (RAM), read-only memory (ROM), erasable programmable memory (e.g., EPROM and EEPROM), or flash memory. The memory 1302 is configured to store computer-readable instructions, sensor values, and other persistent software elements.

The electronic device 1300 may include control circuitry 1310. The control circuitry 1310 may be implemented in a single control unit and not necessarily as distinct electrical circuit elements. As used herein, "control unit" will be used synonymously with "control circuitry." The control circuitry 1310 may receive signals from the processor 1306 or from other elements of the electronic device 1300.

As shown in FIG. 13, the electronic device 1300 includes a battery 1314 that is configured to provide electrical power to the components of the electronic device 1300. The battery 1314 may include one or more power storage cells that are linked together to provide an internal supply of electrical power. The battery 1314 may be operatively coupled to power management circuitry that is configured to provide appropriate voltage and power levels for individual components or groups of components within the electronic device 1300. The battery 1314, via power management circuitry, may be configured to receive power from an external source, such as an alternating current power outlet. The battery 1314 may store received power so that the electronic device 1300 may operate without connection to an external power source for an extended period of time, which may range from several hours to several days.

In some embodiments, the electronic device 1300 includes one or more input devices 1318. The input device 1318 is a device that is configured to receive input from a user or the environment. The input device 1318 may include, for example, a push button, a touch-activated button, a capacitive touch sensor, a touch screen (e.g., a touch-sensitive display or a force-sensitive display), a capacitive touch button, dial, crown, or the like. In some embodiments, the input device 1318 may provide a dedicated or primary function, including, for example, a power button, volume buttons, home buttons, scroll wheels, and camera buttons.

The device 1300 may also include one or more sensors or sensor components 1320, such as a force sensor, a capacitive sensor, an accelerometer, a barometer, a gyroscope, a proximity sensor, a light sensor, or the like. In some cases, the device 1300 includes a sensor array (also referred to as a sensing array) which includes multiple sensors 1320. For example, a sensor array associated with a protruding feature of a cover member may include an ambient light sensor, a Lidar sensor, and a microphone. As previously discussed with respect to FIG. 1B, one or more camera components may also be associated with the protruding feature. The sensors 1320 may be operably coupled to processing circuitry. In some embodiments, the sensors 1320 may detect deformation and/or changes in configuration of the electronic device and be operably coupled to processing circuitry that controls the display based on the sensor signals. In some implementations, output from the sensors 1320 is used to reconfigure the display output to correspond to an orientation or folded/unfolded configuration or state of the device. Example sensors 1320 for this purpose include accelerometers, gyroscopes, magnetometers, and other similar types of position/orientation sensing devices. In addition, the sensors 1320 may include a microphone, an acoustic sensor, a light sensor (including ambient light, infrared (IR) light, ultraviolet (UV) light), an optical facial recognition sensor, a depth measuring sensor (e.g., a time of flight sensor), a health monitoring sensor (e.g., an electrocardiogram (erg) sensor, a heart rate sensor, a photoplethysmogram (ppg) sensor, a pulse oximeter, a biometric sensor (e.g., a fingerprint sensor), or other types of sensing device.

In some embodiments, the electronic device 1300 includes one or more output devices 1304 configured to provide output to a user. The output device 1304 may include a display 1308 that renders visual information generated by the processor 1306. The output device 1304 may also include one or more speakers to provide audio output. The output device 1304 may also include one or more haptic devices that are configured to produce a haptic or tactile output along an exterior surface of the device 1300.

The display 1308 may include a liquid-crystal display (LCD), a light-emitting diode (LED) display, an LED-backlit LCD display, an organic light-emitting diode (OLED) display, an active layer organic light-emitting diode (AMOLED) display, an organic electroluminescent (EL) display, an electrophoretic ink display, or the like. If the display 1308 is a liquid-crystal display or an electrophoretic ink display, the display 1308 may also include a backlight component that can be controlled to provide variable levels of display brightness. If the display 1308 is an organic light-emitting diode or an organic electroluminescent-type display, the brightness of the display 1308 may be controlled by modifying the electrical signals that are provided to display elements. In addition, information regarding configuration and/or orientation of the electronic device may be used to control the output of the display as described with respect to input devices 1318. In some cases, the display is integrated with a touch and/or force sensor in order to detect touches and/or forces applied along an exterior surface of the device 1300.

The electronic device 1300 may also include a communication port 1312 that is configured to transmit and/or receive signals or electrical communication from an external or separate device. The communication port 1312 may be configured to couple to an external device via a cable, adaptor, or other type of electrical connector. In some embodiments, the communication port 1312 may be used to couple the electronic device 1300 to a host computer.

The electronic device 1300 may also include at least one accessory 1316, such as a camera, a flash for the camera, or other such device. The camera may be part of a camera array or sensing array that may be connected to other parts of the electronic device 1300 such as the control circuitry 1310.

As used herein, the terms "about," "approximately," "substantially," "similar," and the like are used to account for relatively small variations, such as a variation of +/−10%, +/−5%, +/−2%, or +/−1%. In addition, use of the term "about" in reference to the endpoint of a range may signify a variation of +/−10%, +/−5%, +/−2%, or +/−1% of the endpoint value. In addition, disclosure of a range in which at least one endpoint is described as being "about" a specified value includes disclosure of the range in which the endpoint is equal to the specified value.

As used herein, the phrase "one or more of" or "at least one of" or "preceding a series of items, with the term "and" or "or" to separate any of the items, modifies the list as a whole, rather than each member of the list. The phrase "one or more of" or "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "one or more of A, B, and C" or "one or more of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

The following discussion applies to the electronic devices described herein to the extent that these devices may be used to obtain personally identifiable information data. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device comprising:
   an optical component;
   a display; and
   an enclosure at least partially enclosing the optical component and comprising a cover member defining an exterior surface and an interior surface, the cover member comprising:
      a first chemically strengthened zone defining a first stress profile comprising a first region of compressive stress extending from the exterior surface to the interior surface; and
      a second chemically strengthened zone positioned over the optical component, surrounded by the first chemically strengthened zone, and defining a second stress profile comprising:
         a second region of compressive stress extending from the exterior surface;
         a third region of compressive stress extending from the interior surface; and
         a region of tensile stress between the second and the third regions of compressive stress; and
      a third chemically strengthened zone positioned over the display and surrounding the first chemically strengthened zone, the third chemically strengthened zone defining a third stress profile different than the first stress profile.

2. The electronic device of claim 1, wherein:
   the cover member defines a front surface of the electronic device; and
   the optical component is a front-facing camera.

3. The electronic device of claim 1, wherein a maximum compressive surface stress of the first chemically strengthened zone is greater than a maximum compressive surface stress of the second chemically strengthened zone.

4. The electronic device of claim 1, wherein:
   the cover member is formed from a glass comprising lithium; and
   the first chemically strengthened zone has a higher sodium concentration than the region of tensile stress of the second chemically strengthened zone.

5. The electronic device of claim 1, wherein the second region of compressive stress has a depth that is substantially equal to a depth of the third region of compressive stress.

6. The electronic device of claim 1, wherein the optical component is a sensor assembly.

7. The electronic device of claim 1, wherein the optical component is a camera assembly.

8. An electronic device, comprising:
a display; and
an enclosure at least partially surrounding the display and including a cover member comprising:
a window portion positioned over the display and having a window stress profile comprising:
an exterior compressive stress region extending from an exterior surface of the cover member;
an interior compressive stress region extending from an interior surface of the cover member; and
a tensile stress region positioned between the exterior and the interior compressive stress regions; and
a set of barrier portions arranged at least partially around the window portion, each barrier portion of the set of barrier portions having a respective barrier stress profile comprising a compressive stress region extending from the exterior surface of the cover member to a depth that is greater than a depth of the exterior compressive stress region of the window stress profile.

9. The electronic device of claim 8 wherein:
each barrier portion of the set of barrier portions is offset from a respective edge of the cover member; and
each barrier portion of the set of barrier portions is spaced apart from an adjacent barrier portion.

10. The electronic device of claim 8, wherein each barrier portion of the set of barrier portions has a diameter greater than or equal to 100 microns and less than or equal to 2 mm.

11. The electronic device of claim 8, wherein a thickness of the cover member at each barrier portion of the set of barrier portions is less than a thickness of the cover member at the window portion.

12. The electronic device of claim 9, wherein the compressive stress region of each respective barrier stress profile extends through a thickness of the cover member.

13. The electronic device of claim 9, wherein each barrier portion of the set of barrier portions is offset from the respective edge by a distance no greater than 5 mm.

14. The electronic device of claim 13, wherein a subset of the set of barrier portions is offset inward from a curved profile defined by a corner portion of the cover member.

15. An electronic device comprising:
an optical component; and
an enclosure comprising a cover member comprising:
a window portion positioned over the optical component and defining a window stress profile comprising:
an exterior compressive stress region extending from an exterior surface of the cover member;
an interior compressive stress region extending from an interior surface of the cover member; and
a tensile stress region positioned between the exterior and the interior compressive stress regions; and
a set of barrier portions arranged at least partially around the window portion, each barrier portion of the set of barrier portions having a respective barrier stress profile comprising a compressive stress region extending from the exterior surface of the cover member to a depth that is greater than a depth of the exterior compressive stress region of the window stress profile.

16. The electronic device of claim 15, wherein:
the cover member defines a rear surface of the electronic device; and
the optical component is part of a sensor assembly.

17. The electronic device of claim 15, wherein the window portion at least partially abuts the set of barrier portions.

18. The electronic device of claim 15, wherein:
the compressive stress region of each respective barrier stress profile extends through a respective thickness of the cover member; and
a concentration of sodium ions in each respective barrier portion of the set of barrier portions is less at a midpoint of the respective thickness than at each of the exterior and the interior surfaces.

19. The electronic device of claim 15, wherein the tensile stress region of the window portion has a greater concentration of lithium ions as compared to a tensile stress region of each respective barrier portion of the set of barrier portions.

20. The electronic device of claim 15, wherein a maximum compressive stress in each respective barrier portion of the set of barrier portions is greater than a maximum compressive stress in the window portion.

* * * * *